United States Patent
Berman et al.

(10) Patent No.: US 11,184,026 B2
(45) Date of Patent: Nov. 23, 2021

(54) SUPER-HPC ERROR CORRECTION CODE

(71) Applicant: Samsung Electronics Co., Ltd., Suwon-si (KR)

(72) Inventors: Amit Berman, Ramat Gan (IL); Ariel Doubchak, Herzliya (IL)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 188 days.

(21) Appl. No.: 16/352,052

(22) Filed: Mar. 13, 2019

(65) Prior Publication Data
US 2020/0295783 A1 Sep. 17, 2020

(51) Int. Cl.
*H03M 13/00* (2006.01)
*H03M 13/11* (2006.01)
*G06F 11/10* (2006.01)
*H03M 13/15* (2006.01)
*G11C 29/42* (2006.01)

(52) U.S. Cl.
CPC ..... *H03M 13/1174* (2013.01); *G06F 11/1012* (2013.01); *G11C 29/42* (2013.01); *H03M 13/152* (2013.01); *H03M 13/1515* (2013.01)

(58) Field of Classification Search
None
See application file for complete search history.

(56) References Cited

U.S. PATENT DOCUMENTS

| | | | |
|---|---|---|---|
| 2007/0043998 A1* | 2/2007 | Lakkis | H03M 13/116 714/758 |
| 2007/0136641 A1* | 6/2007 | Juluri | G11B 20/1833 714/769 |
| 2010/0192043 A1* | 7/2010 | Alrod | H03M 13/1111 714/763 |
| 2017/0139769 A1* | 5/2017 | Blaichman | G11C 29/52 |
| 2019/0007062 A1 | 1/2019 | Twitto et al. | |
| 2019/0164599 A1* | 5/2019 | Avraham | G11C 29/028 |

* cited by examiner

*Primary Examiner* — Mujtaba M Chaudry
(74) *Attorney, Agent, or Firm* — Harness, Dickey & Pierce, P.L.C.

(57) ABSTRACT

A memory controller is configured to perform first error correcting code (ECC) encoding on a plurality of first frames of data, generate a plurality of delta syndrome units corresponding, respectively, to the plurality of first frames of data, generate a delta syndrome codeword by performing second ECC encoding on the plurality of delta syndrome units, the delta syndrome codeword including one or more redundancy data units, perform third ECC encoding on at least one second frame of data such that the encoded at least one second frame of data is a first vector of bits, and determine a second vector of bits such that, adding the second vector of bits to the first vector of bits forms a combined vector of bits which is an ECC codeword having a delta syndrome a value of which is pre-fixed based on at least one of the one or more redundancy data units.

20 Claims, 11 Drawing Sheets

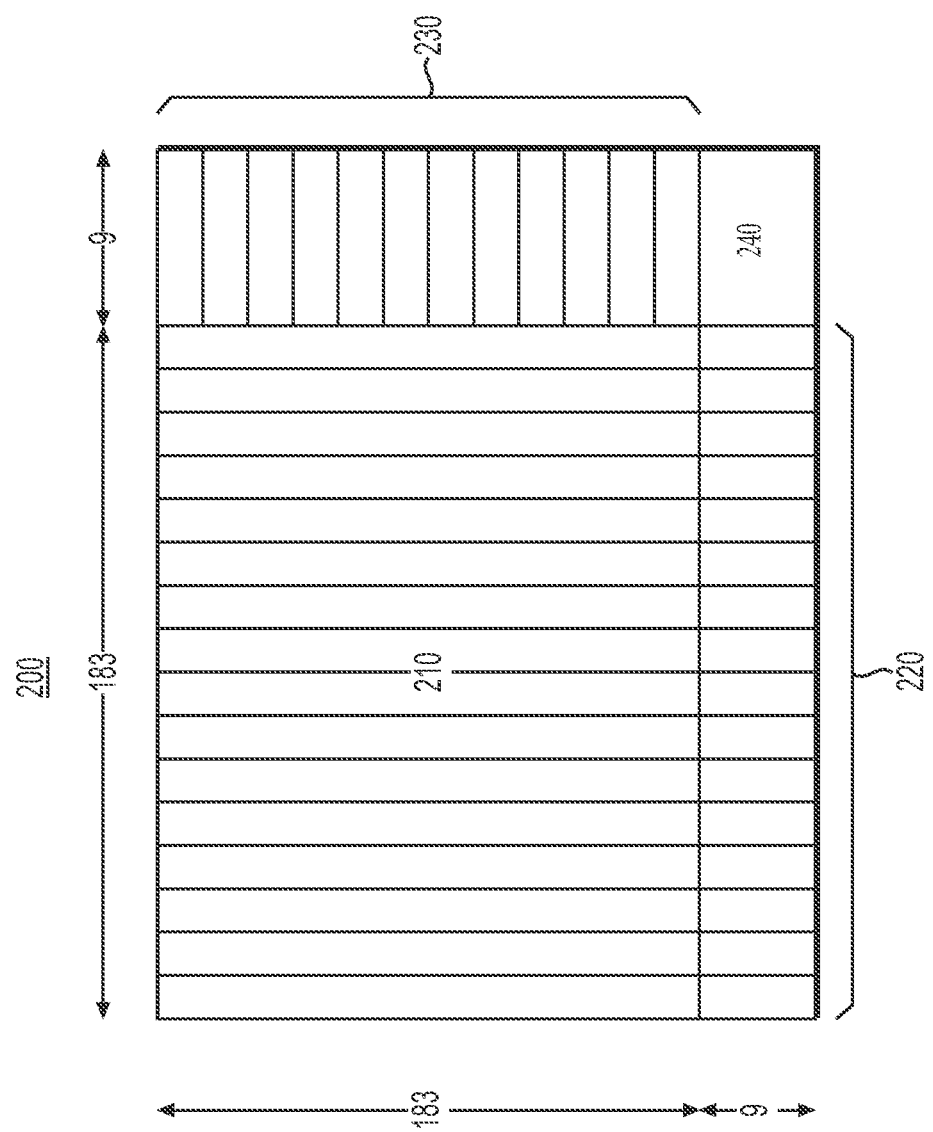

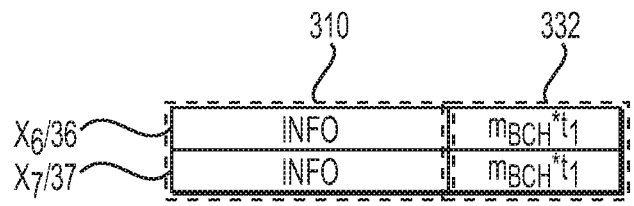
(e)
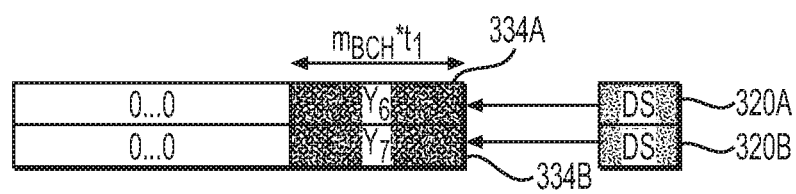
(f)
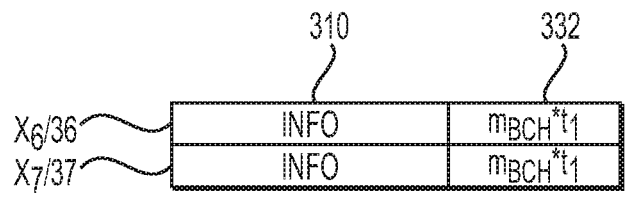
+
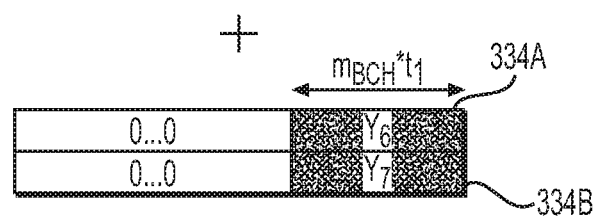
=
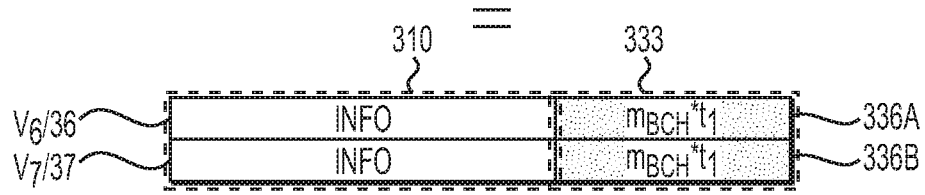
(g)
FIG. 3C

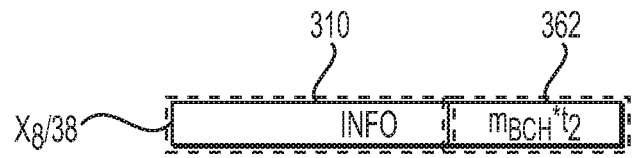
(j)
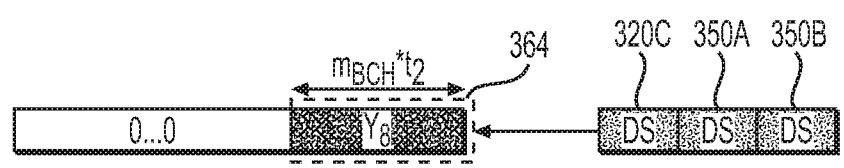
(k)
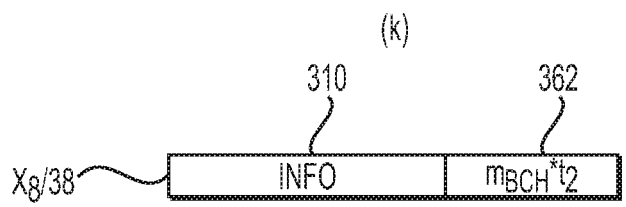
+
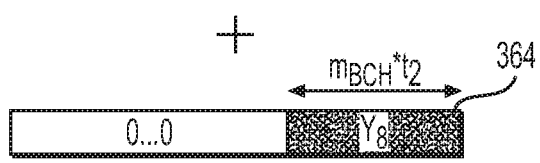
=
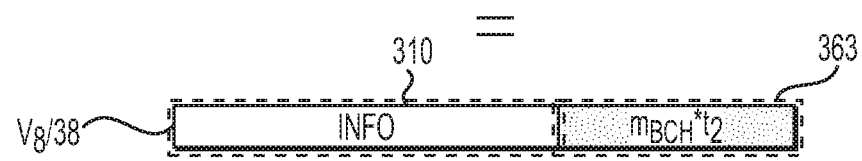
(l)
FIG. 3E

SUPER-HPC ERROR CORRECTION CODE

BACKGROUND

1. Field

The present disclosure relates to a technical field of data storage, and more particularly, relates to methods and devices for storing data using error correction code (ECC).

2. Related Art

An error may arise when data is stored at a memory device and stored data is read from the memory device. Various error correction codes may be used to detect and correct such errors. The error correction codes may include a Reed-Solomon (RS) code, a Bose-Chaudhuri-Hocquenghem (BCH) code, a Low Density Parity Check (LDPC) code, a Hamming Product Code (HPC) and so on.

The performance of error correction codes may improve as a quality (e.g., bit error ratio) of the data improves. However, for some error correction codes, there is a point where the rate at which the performance of the error correction codes improves drops or flattens. This phenomena is referred to as an error floor.

SUMMARY

According to at least some example embodiments of the inventive concepts, a memory system includes a memory controller; and a memory device. According to at least some example embodiments of the inventive concepts, the memory controller is configured to, perform first error correcting code (ECC) encoding on a plurality of first frames of data, generate a plurality of delta syndrome units corresponding, respectively, to the plurality of first frames of data, generate a delta syndrome codeword by performing second ECC encoding on the plurality of delta syndrome units, the delta syndrome codeword including one or more redundancy data units, perform third error correcting code (ECC) encoding on at least one second frame of data such that the encoded at least one second frame of data is a first vector of bits, determine a second vector of bits such that, adding the second vector of bits to the first vector of bits results in a combined vector of bits, and a value of a delta syndrome unit generated based on the combined vector of bits is pre-fixed based on at least one of the one or more redundancy data units, and generate the combined vector of bits.

According to at least some example embodiments of the inventive concepts, a memory system includes a memory controller; and a memory device. According to at least some example embodiments of the inventive concepts, the memory controller is configured to read a plurality of frames of data from the memory device, correct errors in one or more frames of data, from among the plurality of frames of data, by performing first error correcting code (ECC) decoding on the plurality of frames of data, identify, after the first ECC decoding, a plurality of correct frames and at least one error frame from among the plurality of frames of data, generate a plurality of delta syndrome units corresponding, respectively, to the plurality of correct frames, generate, based on the plurality of delta syndrome units, delta syndrome ECC codeword that includes information bits and redundancy bits, such that, the redundancy bits of the delta syndrome ECC codeword are bits of at least one delta syndrome unit from among the generated plurality of delta syndrome units, and the information bits of the delta syndrome ECC codeword are bits of one or more delta syndrome units other than the at least one delta syndrome unit, from among the generated plurality of delta syndrome units, and recover a delta syndrome unit corresponding to the at least one error frame by performing second ECC decoding on the delta syndrome ECC codeword.

According to at least some example embodiments of the inventive concepts, a method of operating a memory system including a memory controller and a memory device includes performing first error correcting code (ECC) encoding on a plurality of first frames of data, generating a plurality of delta syndrome units corresponding, respectively, to the plurality of first frames of data, generating a delta syndrome codeword by performing second ECC encoding on the plurality of delta syndrome units, the delta syndrome codeword including one or more redundancy data units, performing third error correcting code (ECC) encoding on at least one second frame of data such that the encoded at least one second frame of data is a first vector of bits, determining a second vector of bits such that, adding the second vector of bits to the first vector of bits results in a combined vector of bits, and a value of a delta syndrome unit generated based on the combined vector of bits is pre-fixed based on at least one of the one or more redundancy data units, and generating the combined vector of bits.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 2 illustrates an example of a product code codeword according to at least some example embodiments of the inventive concepts.

FIGS. 3A-3F illustrate operations for performing a projected Bose-Chaudhuri-Hocquenghem (BCH) encoding algorithm according to at least some example embodiments of the inventive concepts.

DETAILED DESCRIPTION

Figure 1:
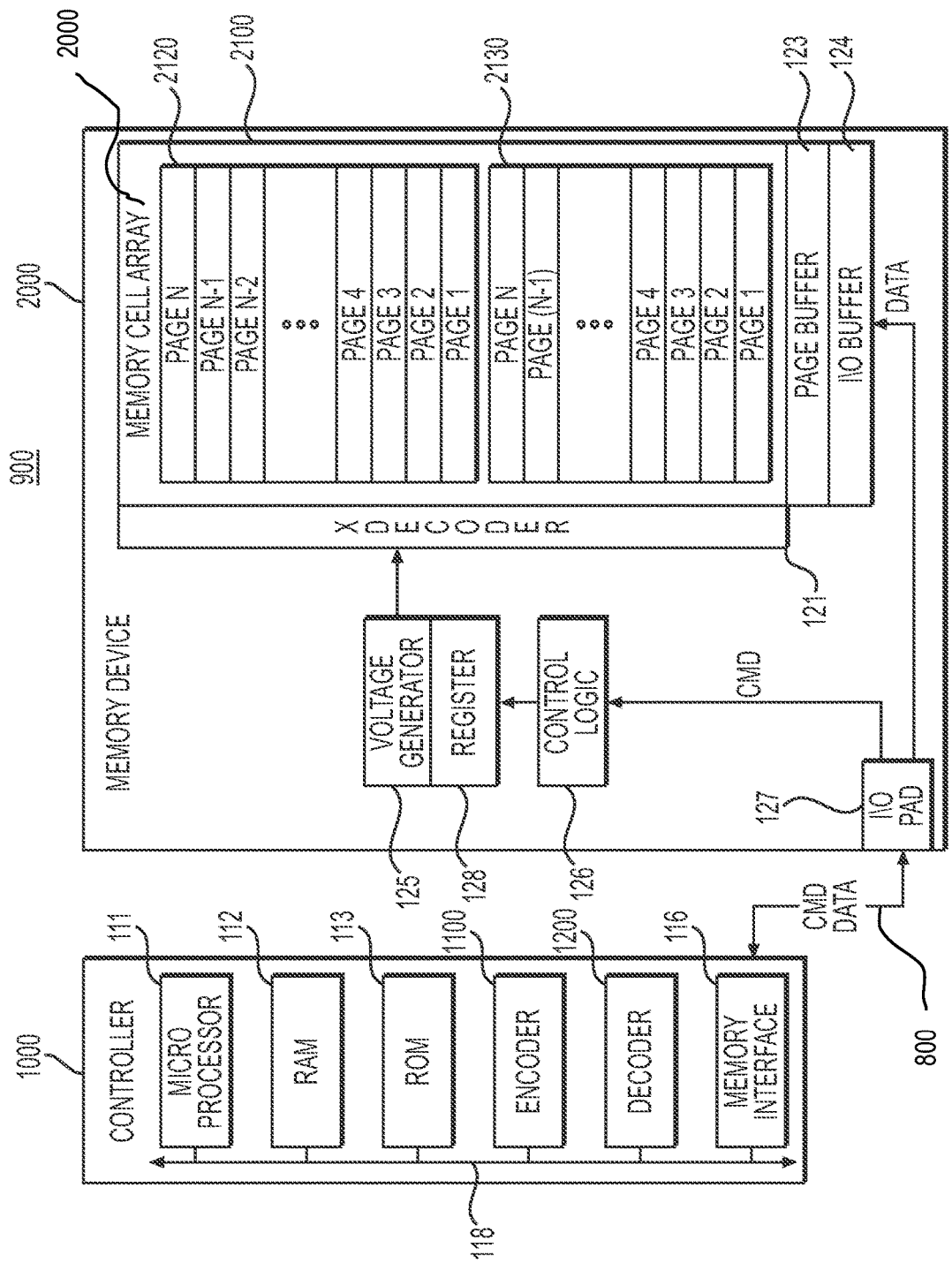
FIG. 1 is a diagram showing a memory system according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

I. Overview

According to at least some example embodiments, as is discussed in greater detail below, using projected BCH encoding operations during the process of ECC encoding a Hamming Product Code (HPC) codeword may result in improving an error floor associated with the process of performing ECC decoding on the HPC codeword. For example, as is discussed in greater detail below, by generating delta syndromes for frames of the HPC codeword, performing ECC encoding on the generated delta syndromes, themselves, and storing the redundancy data resulting from encoding the delta syndromes, missing delta syndromes may be recovered during the process of decoding the HPC codeword. For example, as is discussed in greater detail, below, when decoding the HPC codeword, the recovered delta syndromes may be used during a decoding operation to improve an error correcting capability of ECC code used to encode the HPC codeword. Consequently, an error floor associated with the ECC decoding operation may be improved.

Further, according to at least some example embodiments of the inventive concepts, as is discussed in greater detail below, selected frames of the HPC codeword may be encoded in such a manner that delta syndromes corresponding to the selected frames have desired or pre-fixed values. Consequently, by choosing, as the pre-fixed values, values of the aforementioned redundancy data resulting from encoding delta syndromes of other frames, the redundancy data is essentially embedded into the delta syndromes generated for the selected frames. Consequently, the need to store the aforementioned redundancy data separately is reduced or, alternatively, eliminated. Thus, storage space requirements associated with using projected BCH to encode the HPC codeword may be advantageously reduced.

An example memory system 900 for performing the aforementioned encoding and/or decoding operations is discussed in greater detail below in Section II of the present disclosure. Example Hamming Product Code (HPC) encoding operations are discussed in greater detail below in Section III of the present disclosure. Example projected Bose-Chaudhuri-Hocquenghem (BCH) encoding operations are discussed in greater detail below in Section IV of the present disclosure. Example methods for generating a BCH codeword having pre-fixed delta syndrome values are discussed in greater detail below in Section V of the present disclosure. Example decoding operations are discussed in greater detail below in Section VI of the present disclosure.

Implementation examples corresponding to the memory system 900 are discussed in greater detail below in Section VII of the present disclosure.

The memory system 900 according to at least some example embodiments of the inventive concepts will now be discussed below in Section II of the present disclosure.

II. Example Memory System

FIG. 1 is a diagram showing the memory system 900 according to at least one example embodiment of the inventive concepts. Referring to FIG. 1, the memory system 900 includes the memory controller 1000 and a nonvolatile memory device 2000.

The nonvolatile memory device 2000 may be, but is not limited to, a flash memory device, a NAND flash memory device, a phase change RAM (PRAM), a ferroelectric RAM (FRAM), a magnetic RAM (MRAM), etc. According to at least one example embodiment of the inventive concepts, the nonvolatile memory device 2000 may include a plurality of NAND flash memory devices. The nonvolatile memory device 2000 may have a planar structure or a three-dimensional (3D) memory cell structure with a stack of memory cells.

The memory device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

The memory cell array 2100 includes a plurality of word lines and a plurality of bit lines. Each memory cell of the memory cell array 2100 may be implemented as a nonvolatile memory cell. For example, each memory cell of the memory cell array 2100 may have, for example, a floating gate or a charge storage layer such as a charge trapping layer.

The memory cell array 2100 may include a plurality of blocks and a plurality of pages. One block includes a plurality of pages. A page may be a unit of program and read operations, and a block may be a unit of erase operation. For example, the memory cell array 2100 includes a first block 2120 and a second block 2130. As is illustrated n FIG. 1A, the first block 2120 includes pages 1-N, and the second block 2130 includes pages 1-N, where N is a positive integer greater than 1.

The control logic 126 controls the overall operation of the memory device 2000. When receiving a command CMD from the memory controller 1000, the control logic 126 interprets the command CMD and controls the memory device 2000 to perform an operation (e.g., a program operation, a read operation, a read retry operation, or an erase operation) according to the interpreted command CMD.

According to at least one example embodiment, the control logic 126 may include a hardware-implemented processor configured to execute commands based on command signal CMD. According to at least one example embodiment of the inventive concepts, in addition to the processor, the control logic 126 may also include a storage unit for storing steps that, when executed by the processor included in the control logic 126, cause the processor to perform specific operations. According to at least one example embodiment of the inventive concepts, any operations described herein as being performed by the memory device 2000 may be performed by, or under the control of, the control logic 126, for example, by the processor included in the control logic 126 driving firmware stored in the storage unit included in the control logic 126. Alternatively, the control logic 126 may be a circuit (e.g. an application specific integrated circuit (ASIC)) that is physically programmed, in terms of hardware, to perform or control any operations described herein as being performed by the memory device 2000.

The X decoder 121 is controlled by the control logic 126 and drives at least one of the word lines in the memory cell array 2100 according to a row address.

The voltage generator 125 is controlled by the control logic 126 to generate one or more voltages required for a write operation, a read operation or an erase operation and provide the generated voltages to one or more rows selected by the X decoder 121.

A register 128 is controlled by the control logic 126, is a space in which information input from the memory controller 1000 is stored, and may include a plurality of latches. For example, the register 128 may group read voltage (and/or reference voltage) information and store the information in the form of a table.

The page buffer 123 is controlled by the control logic 126 and operates as a sense amplifier or a write driver according to an operation mode (e.g., a read operation or a write operation).

The I/O pad 127 and the I/O buffer 124 may serve as I/O paths of data exchanged between an external device, e.g., the memory controller 1000 or a host and the memory device 2000. The I/O pad 127 is connected to the memory controller 1000 through a memory system bus 800. Data and or commands may be output from memory device 2000 to the memory controller 1000 or received from the memory controller 1000 at the memory device 2000 via the I/O pad 127 and the memory system bus 800.

According to at least some example embodiments of the inventive concepts, the memory device 2000 operates in response to commands and/or control signals generated by the memory controller 1000. Thus, operations described in the present disclosure as being performed, executed or controlled by the memory device 2000 may be referred to, additionally or alternatively, as operations that are performed, executed or controlled by the memory controller 1000.

The memory controller 1000 may include a microprocessor 111, a read-only memory (ROM) 113, a random access memory (RAM) 112, an encoder 1100, a decoder 1200, a memory interface 116, and a controller bus 118. The elements 111 through 116 of the memory controller 1000 may be electrically connected to each other through the controller bus 118.

The microprocessor 111 controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to at least one example embodiment of the inventive concepts, the microprocessor 111 may also issue commands, or output control signals, for controlling operations of other elements of the memory controller 1000 including, for example, some or all of the ROM 113, RAM 112, encoder 1100, decoder 1200, memory interface 116, and controller bus 118. According to at least one example embodiment of the inventive concepts, any operations described herein as being performed by the memory controller 1000 may be performed by, or under the control of, the microprocessor 111, for example, by the microprocessor driving the above-referenced firmware.

While a driving firmware code of the memory system 900 is stored in the ROM 113, one or more example embodiments of the inventive concepts are not limited thereto. The firmware code can also be stored in a portion of the memory system 900 other than the ROM 113. Therefore, the control or intervention of the microprocessor 111 may encompass not only the direct control of the microprocessor 111 but also the intervention of firmware which is software driven by the microprocessor 111.

Alternatively, the microprocessor 111 may be a circuit (e.g. an (ASIC)) that is physically programmed, in terms of hardware, to perform or control any operations described herein as being performed by the memory controller 1000.

The RAM 112, which is a memory serving as a buffer, may store an initial command, data, and various variables input from a host or the microprocessor 111, or data output from the memory device 2000. The RAM 112 may store data and various parameters and variables input to and output from the memory device 2000. According to at least some example embodiments of the inventive concepts.

The memory interface 116 may serve as an interface between the memory controller 1000 and the memory device 2000. The memory interface 116 is connected to the I/O pad 127 of the memory device 2000 via the memory system bus 800 and may exchange data with the I/O pad 127 via the memory system bus 800. In addition, the memory interface 116 may create a command suitable for the memory device 2000 and provide the created command to the I/O pad 127 of the memory device 2000. The memory interface 116 provides one or more commands to be executed by the memory device 2000 and one or more addresses ADD of the memory device 2000.

According to at least one example embodiment of the inventive concepts, the decoder 1200 may be an error correcting code (ECC) decoder, and the encoder 1100 may be an ECC encoder. According to at least one example embodiment of the inventive concepts, the decoder 1200 and the encoder 1100 perform error bit correction. The encoder 1100 may generate data added with one or more parity and/or redundancy bits by performing error correction encoding on data before the data is provided to the nonvolatile memory device 2000. The one or more parity and/or redundancy bits may be stored in the nonvolatile memory device 2000.

The decoder 1200 may perform error correction decoding on output data, determine whether the error correction decoding is successful based on the result of the error correction decoding, and output an instruction signal based on the determination result. Read data may be transmitted to the decoder 1200, and the decoder 1200 may correct error bits of the data using the one or more parity and/or redundancy bits. When the number of error bits exceeds a limit of error bits that can be corrected, the decoder 1200 cannot correct the error bits, resulting in error correction failure.

Each of the encoder 1100 and the decoder 1200 may include an error correction circuit, system or device. The encoder 1100 and the decoder 1200 may perform error correction using, for example, one or more of low density parity check (LDPC) code, Bose-Chaudhuri-Hocquenghem (BCH) code, turbo code, Reed-Solomon (RS) code, convolution code, recursive systematic code (RSC), or coded modulation such as trellis-coded modulation (TCM) or block coded modulation (BCM). Further, as is discussed in greater detail below, the encoder 1100 and the decoder 1200 may perform error correction using Hamming product code (HPC).

Example encoding operations according to at least some example embodiments of the inventive concepts will now be discussed below in Section III of the present disclosure.

III. Example Encoding Operations

Product codes (or iterated codes), generally, are serially concatenated codes. The concept of product codes is relatively simple and relatively efficient for building very long block codes by using two or more short block codes. For example, a product code P can be defined as $P=C^1 \otimes C^2$, where $C^1$ and $C^2$ are first and second systematic linear block codes, the first code $C^1$ has parameters $(n_1, k_1, \delta_1)$, the second code $C^2$ has parameters $(n_2, k_2, \delta_2)$, and $n_i$, $k_i$ and $\delta_i$ refer to codeword length, number of information bits, and minimum Hamming distance, respectively. One type of product code is a Hamming Product Code (HPC). For example, when the first and second codes $C^1$ and $C^2$ are each extended Hamming codes, the product code P is a HPC. Encoding data using an HPC results in an HPC codeword. FIG. 2 illustrates an example of a HPC codeword 200. A process of encoding data using HPC will now be discussed below with reference to Algorithm 1 and HPC codeword 200.

Operations of Algorithm 1 are illustrated below using pseudocode. According to at least some example embodiments of the inventive concepts, each operation of Algorithm 1 may be performed by, or under the control of, the memory controller 1000 (e.g., using the microprocessor 111).

---
Algorithm 1
---

(A1) Receive (k1×k2) information bits and arrange received information bits in an array of $k_1$ rows and $k_2$ columns;
(A2) Encode the $k_1$ rows using code $C^2$; and
(A3) Encode the $n_2$ columns using code $C^1$.

---

Algorithm 1 will be discussed with respect to a scenario in which the first and second codes $C^1$ and $C^2$ are each extended Hamming codes, $k_1$ and $k_2$=183, and $n_1$ and $n_2$=192. Consequently, the parameters of the resulting product code P are $n=n_1 \times n_2$, $k=k_1 \times k_2$, $\delta=\delta_1 \times \delta_2$, and the code rate R is given by $R=R_1 \times R_2$, where $R_i$ is the code rate of the first code $C^i$. Further, in the present disclosure "redundancy" data, bits, etc. may also be referred to as "parity" data, bits, etc. Additionally, in the present disclosure, "redundancy" or "parity" data, bits, etc., may be referred to, generally, as "overhead" (e.g., of an ECC code like BCH code or RS code).

Referring to Algorithm 1, in operation (A1), the memory controller 1000 receives information bits (e.g., from an external device) and arranges the information bits 210 in $k_1$ rows and $k_2$ columns. Accordingly, the memory controller 1000 arranges information bits 210 in 183 columns and 183 rows, as is illustrated by the codeword 200 in FIG. 2. A row of data (e.g., a row of the HPC codeword 200) may also be referred to, in the present disclosure, as a "frame."

In operation (A2), the memory controller 1000 encodes the $k_1$ rows using the second code $C^2$. For example, referring to the HPC codeword 200 in FIG. 2, the memory controller 1000 encodes the 183 rows of the information bits 210 using the second code $C^2$, thus generating 183 corresponding rows of redundancy data illustrated in FIG. 2 as redundancy rows 230. In the example illustrated in FIG. 2, the 183 redundancy rows 230 each include 9 redundancy bits. For example, because, as discussed above, the second code $C^2$ is an extended Hamming code, the 9 redundancy bits may include 8 extended Hamming code parity bits and an additional parity bit for a total of 8+1=9 redundancy bits. Accordingly, each row of the HPC codeword 200 includes $n_2$ (i.e., 183+9=192=$n_2$) bits. Consequently, the HPC codeword 200 includes $n_2$ columns.

In operation (A3), the memory controller 1000 encodes the $n_2$ columns using the first code $C^1$. For example, referring to the codeword 200 in FIG. 2, the memory controller 1000 encodes the 183 columns of the information bits 210 using the first code $C^1$ thus resulting in 183 redundancy columns 220. In the example illustrated in FIG. 2, the 183 redundancy columns 220 each include 9 bits. Further, the memory controller 1000 encodes the 9 columns of bits included in the 183 redundancy rows 230 using the first code $C^1$ thus resulting in a 9×9 bit check-on-check block 240.

Though, Algorithm 1 is described above with referent to an example scenario in which the rows of the information bits 210 are encoded first (e.g., in operation (A2), and columns of the encoded rows are encoded thereafter (e.g., in operation (A3), according to at least some example embodiments of the inventive concepts, operation (A3) may be performed before operation (A2) (i.e., operation (A3) may include encoding the $k_2$ columns using code $C^1$ and, operation (A2) may include encoding the $n_1$ rows using code $C^2$, after operation (A3)).

According to at least some example embodiments of the inventive concepts, after operations (A1)-(A3), the memory controller 1000 stores the HPC codeword 200 on the memory device 2000. For example, the memory controller 1000 may transmit the HPC codeword 200 and one or more write commands to the memory device 2000, and the memory device 2000 may respond to the one or more write commands by writing the HPC codeword 200 to memory cell array 2100 (e.g., writing the HPC codeword 200 to a memory page of the memory cell array 2100).

As is noted above, the parameters of the resulting product code P are $n=n_1 \times n_2$, $k=k_1 \times k_2$, $\delta=\delta_1 \times \delta_2$, and the code rate R is given by $R=R_1 \times R_2$, where $R_i$ is the code rate of the first code $C^i$. Thus, relatively long block codes can be constructed with relatively large minimum Hamming distances by combining short codes with small minimum Hamming distances. Given the procedure used to construct the product code P, the $(n_2-k_2)$ last columns of the codeword 200 are codewords of the first code $C^1$. By using the matrix generator, one can show that the $(n_1-k_1)$ last rows of the codeword 200 are codewords of the second code $C^2$. Hence, all of the rows of the codeword 200 are codewords of the first code $C^1$ and all of the columns of the codeword 200 are codewords of the second code $C^2$.

According to at least some example embodiments of the inventive concepts, operation (A2) of Algorithm 1 may be performed using Projected BCH encoding, which will now be discussed in greater detail, below, in Section IV of the present disclosure.

IV. Projected BCH Encoding

According to at least some example embodiments of the inventive concepts, a projected BCH encoding algorithm is applied to rows of a (e.g., codeword 200), for example, in accordance with Algorithm 2 discussed below. For example, according to at least some example embodiments of the inventive concepts, the projected BCH encoding algorithm is applied in addition to, or, alternatively, in place of, the extended Hamming code encoding discussed above with reference to operation (A2) of Algorithm 1. For example, according to at least some example embodiments of the inventive concepts, operation (A2) of Algorithm 1 includes performing the projected BCH encoding operations of Algorithm 2, discussed below, on $k_1$ rows of data corresponding to codeword 200 (i.e., instead of performing extended Hamming code encoding on the $k_1$ rows); and generating and storing a parity bit for each row of the HPC codeword 200. The parity bit may be generated in accordance with known methods.

Further, according to at least some example embodiments of the inventive concepts, with respect to operation (A3) of Algorithm 1, the extended Hamming code encoding discussed above with reference to Algorithm 1 is performed on the columns of a codeword (e.g., codeword 200), but the projected BCH encoding discussed below with respect to Algorithm 2 is not applied to columns of the codeword (e.g., codeword 200).

Thus, according to at least some example embodiments of the inventive concepts, in Algorithm 1: projected BCH encoding in accordance with Algorithm 2 is performed, by the memory controller 1000, on rows of information bits of a codeword, and, next, extended Hamming code encoding is performed, by the memory controller 1000, on columns of bits from among the projected BCH-encoded rows of information bits, thereby generating a two-dimensional HPC codeword.

Further, according to at least some other example embodiments of the inventive concepts, in Algorithm 1: extended Hamming code encoding is performed, by the memory controller 1000, on columns of information bits of a codeword, and, next, projected BCH encoding in accordance with Algorithm 2 is performed, by the memory controller 1000, on rows of bits from among the extended Hamming code-encoded columns of information bits, thereby generating a two-dimensional HPC codeword.

As is discussed in greater detail below with reference to Algorithm 2, the projected BCH encoding algorithm includes performing BCH encoding on rows of data from among information bits 210 thereby generating BCH redundancy data for each row. Further, the projected BCH encoding algorithm includes generating delta syndromes (ds) for enhancing an error correction capability of the aforementioned BCH redundancy data. Each delta syndrome may correspond to one of a plurality of stages i. The total number of erroneous bits per row which can be properly corrected with the aid of corresponding delta syndromes of stage i is represented as $t_i$ (or ti). Further, as is discussed in greater detail below with reference to Algorithm 2, delta syndromes of the same stage are concatenated and encoded using RS code, thereby generating RS redundancy data. The error correction capability of the RS code varies as the stage of the delta syndromes being encoded varies. A total number of erroneous rows for which delta syndrome data of stage can be properly corrected using the above-referenced RS redundancy data for stage i is represented as $F_i$ (or Fi).

Consequently, parameters of the projected BCH encoding algorithm may be represented by a vectors F and t. For the purpose of simplicity, Algorithm 2 will be explained, below, with reference to only 8 frames of data (i.e., first frame 31 through eighth frame 38) of a codeword 300, as is illustrated in FIGS. 3A-3F. Further, Algorithm 2, below, will be explained with reference to an example in which vector F=[F0 F1 F2]=[8 3 1] and vector t=[t0 t1 t2]=[6 7 9].

Though, for the purpose of simplicity, Algorithm 2 is explained below with reference to 8 frames of information bits included in codeword 300, Algorithm 2 may be performed with respect to more than 8 frames of data. For example, the memory controller 1000 may perform Algorithm 2 with respect to the 192 frames of bits included in HPC codeword 200 illustrated in FIG. 2.

Operations of Algorithm 2 are illustrated below using pseudocode. According to at least some example embodiments of the inventive concepts, each operation of Algorithm 2 may be performed by, or under the control of, the memory controller 1000 (e.g., using the microprocessor 111).

---

Algorithm 2

---

Part 0
(B1) Encode F0 - F1 frames with error correct capability t0;
Part 1
(B2) Generate delta syndromes for F0-F1 frames;
(B3) Generate F1 RS overhead for t1-t0 ds;
(B4) For F1-F2 frames, encode with error correction capability t1 and set as x;
(B5) For the F1-F2 frames, calculate y vectors;
(B6) Set, as F1-F2 frames, v = x+y;
Part 2
(B7) Generate delta syndromes for F1-F2 frames;
(B8) Generate F2 RS overhead for t2-t1 ds;
(B9) For F2 frames, encode with error correction capability t2 and set as x;
(B10) For the F2 frames, calculate yvec and set as y;
(B11) Set, as F2 frames, v = x+y.

---

According to at least some example embodiments of the inventive concepts, Algorithm 2 has three parts: part 0, part 1 and part 2. Referring to Part 0, in operation (B1), the memory controller 1000 encodes F0-F1 frames with an error correction capability of t0 bits. For example, F0-F1=8−3=5. Consequently, as is illustrated in in FIG. 3A, information bits 310 of first through fifth frames 31-35 (e.g., the first F0-F1=5 frames) are encoded using BCH codes capable of correcting t0 bits, thus generating BCH redundancy data 315. Accordingly, as is illustrated in item (b) of FIG. 3A, $m_{BCH}*t0$ bits of BCH redundancy data are generated for each of the first through fifth frames 31-35, where $m_{BCH}$ refers to a number of bits in a Galois field corresponding to the BCH code. In the example illustrated in FIGS. 3A-3F, $m_{BCH}=8$. Consequently, for each of the first through fifth frames 31-35, the memory controller 1000 generates $m_{BCH}*t0=8\times6=48$ bits of BCH redundancy data. In the present disclosure, the value $m_{BCH}$ may also be referred to on occasion as, simply, m.

Figure 3A:
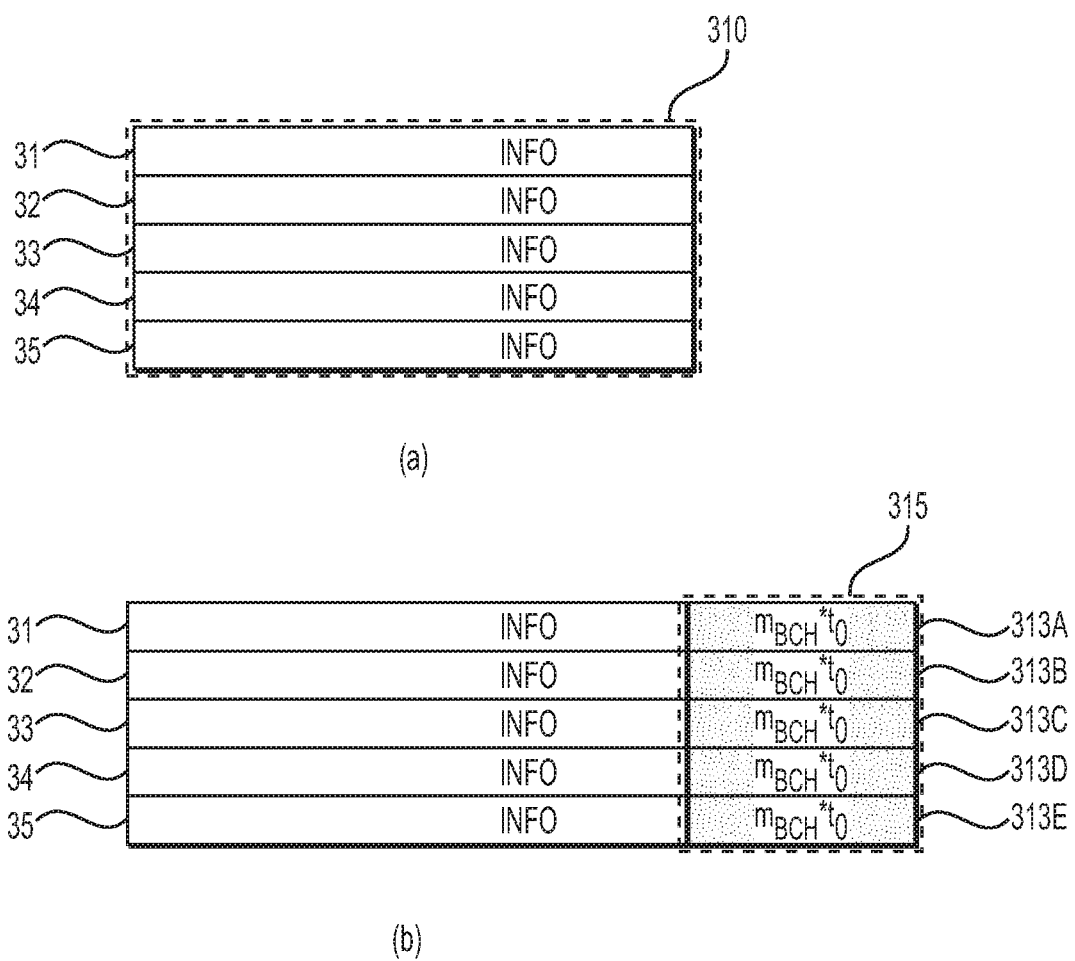
Figure 3B:
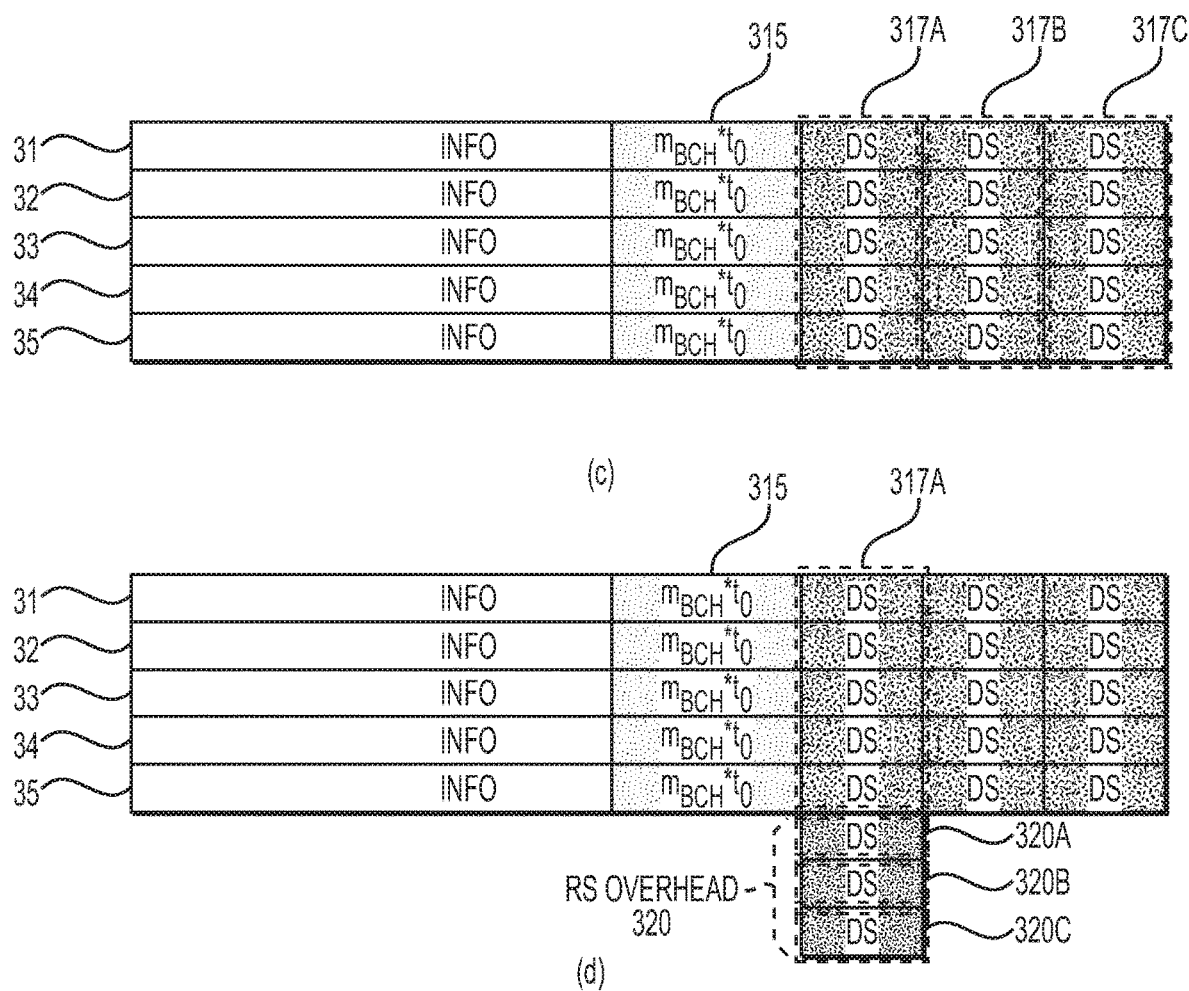

Next, referring to Part 1 of Algorithm 2, in operation (B2), the memory controller 1000 generates delta syndromes for F0-F1 frames. For example, as is illustrated in item (c) of FIG. 3B, for each of the first F0-F1=5 frames (i.e., first through fifth frames 31-35), the memory controller 1000 generates stage 1 delta syndromes 317A, first stage 2 delta syndromes 317B, and second stage 2 delta syndromes 317C. In the present disclosure, delta syndromes may also be referred to as "ds." According to at least some example embodiments of the inventive concepts, as is illustrated in FIG. 3B, the stage 1 ds 317A may include F0-F1=5 individual delta syndrome units and may be used during a BCH decoding operation to increase the error correction strength of the BCH redundancy data 315 from t0 bits to t1 bits. According to at least some example embodiments of the inventive concepts, as is illustrated in FIG. 3B, the first and second stage 2 ds 317B and 317C may each include F0-F1=5 individual ds units and may be used during a BCH decoding operation, together with the stage 1 ds 317A, to increase the error correction strength of the BCH redundancy data 315 to t2 bits. The ds 317A-317C may be generated in accordance with known methods for generating ds.

In operation (B3), the memory controller 1000 generates F1 units of Reed-Solomon (RS) code overhead (i.e., F1 units of RS redundancy data) for t1-t0 columns of ds. For example, according to at least some example embodiments of the inventive concepts, as is illustrated in item (d) of FIG. 3B, the memory controller 1000 may concatenate individual units of the stage 1 ds 317A (i.e., the first [t1−t0=7−6=1] column of ds among ds 317A-317C), and encode the concatenated units of the stage 1 ds 317A using RS code. As a result of the encoding, the memory controller 1000 generates RS overhead 320. As is illustrated in item (d) of FIG. 3B, RS overhead 320 includes F1=3 units of RS overhead, first through third RS overhead units 320A, 320B and 320C. According to at least some example embodiments of the inventive concepts, each of the first through third RS overhead units 320A-320C may have the same size (e.g., the same number of bits) as the individual ds units included in the ds 317A-317C. The term "RS overhead unit" is considered to be synonymous with, and may also be referred to as, "RS redundancy data unit" in the present disclosure. According to at least some example embodiments of the inventive concepts, each box labeled "ds" in FIGS. 3B-3F represents an individual ds unit. According to at least some example embodiments of the inventive concepts, a single delta syndrome can include one or more ds units. For example, according to at least some example embodiments of the inventive concepts, first and second stage 2 ds 317B and 317C, combined, can be considered a plurality of stage 2 delta syndromes which each include 2 ds units.

In operation (B4), for F1-F2 frames, the memory controller 1000 encodes the frames using a code having an error correction capability of t1 bits, and sets the result of the encoding as vectors x. For example, the memory controller 1000 may encode F1-F2=3−1=2 frames using BCH code having an error correction capability of t1=7 bits. According to at least some example embodiments of the inventive concepts, the F1-F2 frames encoded in operation (B4) may be the next F1-F2 (e.g., 2) frames following the F0-F1 (e.g., 5) frames that were encoded in operation (B1). For example, in the example illustrated in FIGS. 3A-3F, in operation (B4), the memory controller 1000 encodes the information bits 310 of sixth and seventh frames 36 and 37, thereby generating intermediate BCH redundancy data 332, as is shown in item (e) of FIG. 3C. As is illustrated in item (e) of FIG. 3C, for each of the sixth and seventh frames 36 and 37, the intermediate BCH redundancy data 332 includes $m_{BCH}*t1=8\times7=56$ bits. Next, the memory controller 1000 may set, as a vectors x (i.e., vectors corresponding to the sixth frame 36 and the seventh frame 37, respectively), information bits 310 and intermediate redundancy data 332 of each of the sixth and seventh frames 36 and 37. For example, the sixth frame 36 of item (e) illustrated in FIG. 3C may correspond to a vector $x_6$, and the seventh frame 37 of item (e) illustrated in FIG. 3C may correspond to a vector $x_7$.

In operation (B5), for the F1-F2 frames, the memory controller 1000 calculates y vectors. According to at least some example embodiments of the inventive concepts, as will be discussed in greater detail below in Section V of the present disclosure, a y vector, $y_r$, calculated in operation (B5) for an $r^{th}$ frame (r being a positive integer) is a vector that, when added to a corresponding x vector, $x_r$, set in operation (B4) for the $r^{th}$ frame, results in a $r^{th}$ frame combined vector $v_r$ such that values of one or more units of ds generated for the $r^{th}$ frame combined vector $v_r$ match desired (e.g., pre-fixed) values. Specifically, as will be discussed in greater detail below with reference to FIGS. 3C and 3D, in operation (B5), the memory controller 1000 determines $6^{th}$ frame and $7^{th}$ frame y vectors, vector $y_6$ 334A and vector $y_7$ 334B, such that, after 6th frame y vector $y_6$ 334A and $7^{th}$ frame y vector $y_7$ 334B are added to $6^{th}$ and $7^{th}$ frame x vectors $x_6$ and $x_7$ (i.e., the data of frames 36 and 37 of item (e) of FIG. 3C), respectively, values of stage 1 ds units generated for the sixth frame 36 (i.e., combined vector $v_6$) and the seventh frame 37 (i.e., combined vector $v_7$) will equal, respectively, the values of the first and second RS overhead units 320A and 320B generated in operation (B3).

Referring, again, to operation (B5), as is illustrated in item (f) of FIG. 3C, the memory controller 1000 may use the first RS overhead unit 320A to generate $6^{th}$ frame y vector $y_6$ 334A corresponding to the sixth frame 36, use the second RS overhead unit 320B to generate $7^{th}$ frame y vector $y_7$ 334B corresponding to the seventh frame 37. Next, in operation (B6), as is illustrated by item (g) in FIG. 3C, the memory controller 1000 combines the y vectors corresponding to the sixth and seventh frames 36 and 37 (i.e., $6^{th}$ and $7^{th}$ frame y vectors, $y_6$ 334A and $y_7$ 334B) with the x vectors corresponding to the sixth and seventh frames 36 and 37, $x_6$ and $x_7$ generated in operation (B4) of Algorithm 2 (i.e., the information bits 310 and intermediate BCH redundancy data 332 corresponding to the sixth and seventh frames 36 and 37) thereby generating combined vectors $v_6$ and $v_7$ corresponding to the sixth and seventh frames 36 and 37, respectively. Combined vector $v_6$ includes information bits 310 and final BCH redundancy data 333 corresponding to the sixth frame 36, and combined vector $v_7$ includes information bits 310 and final BCH redundancy data 333 corresponding to the seventh frame 37. As is illustrated by item (f) in FIG. 3C, the final BCH redundancy data 333 may include first final BCH redundancy data 336A corresponding to the sixth frame 36 and second final BCH redundancy data 336B corresponding to the seventh frame 37. At this point, as was discussed above, if stage 1 ds units were generated based on sixth and seventh frames 36 and 37 (i.e., combined vectors $v_6$ and $v_7$), the values of the stage 1 ds units would be equal to the values of the first and second RS overhead units 320A and 320B, respectively.

Figure 3D:
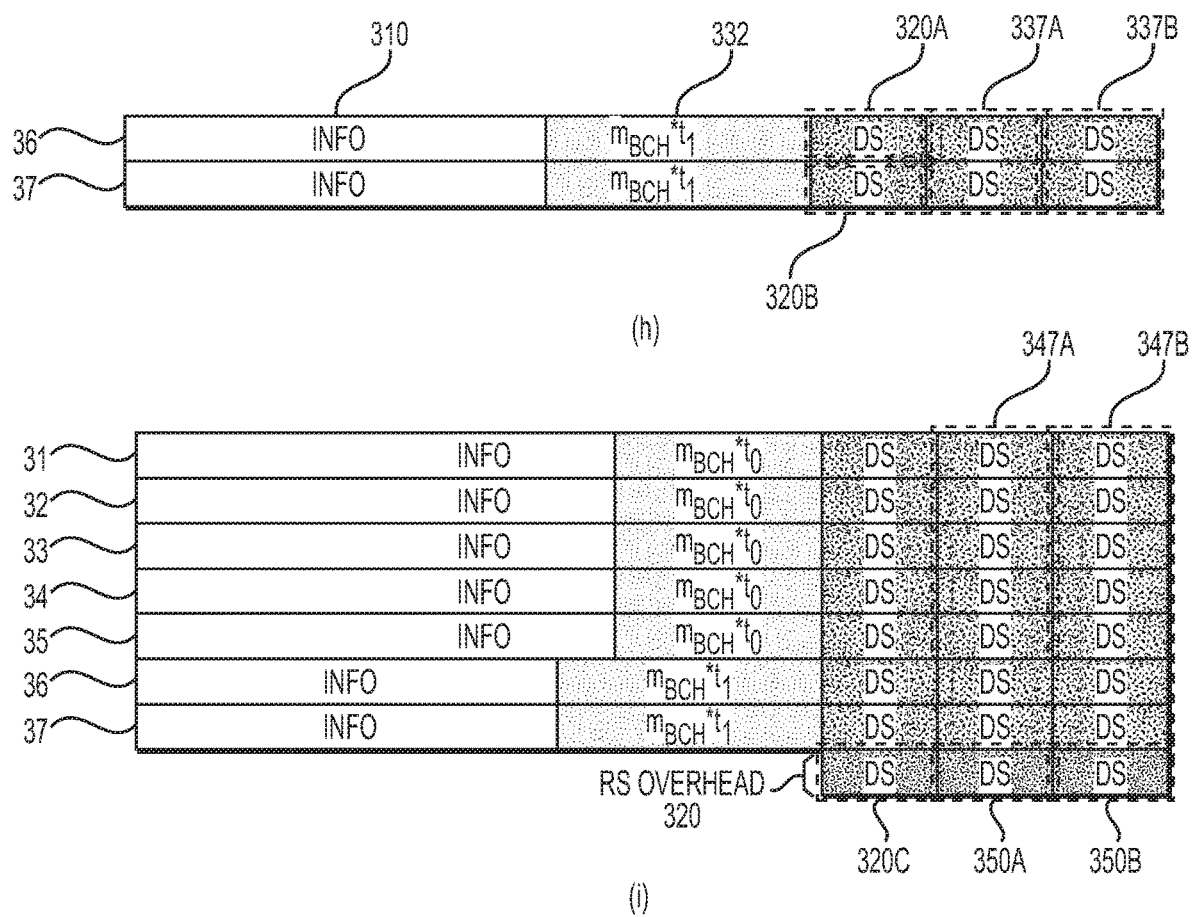

Next, referring to Part 2 of Algorithm 2, in operation (B7), the memory controller 1000 generates delta syndromes for F1-F2 frames. For example, as is illustrated in item (h) of FIG. 3D, for each of F1-F2=2 frames (i.e., the next 2 frames following the F0-F1=5 frames for which delta syndromes were generated in operation (B2), sixth through seventh frames 36-37), the memory controller 1000 generates, as stage 1 delta syndromes, the first and second RS overhead units 320A and 320B, generates first stage 2 delta syndromes 337A, and generates second stage 2 delta syndromes 337B. According to at least some example embodiments of the inventive concepts, as is illustrated in FIG. 3D, the first stage 2 ds 337A and second stage 2 ds 337B may each include F1-F2=2 individual ds units and may be used during a BCH decoding operation to increase the error correction strength of the final BCH redundancy data 333 of the sixth and seventh frames 36 and 37 from t1 bits to t2 bits. The ds 337A-337B may be generated in accordance with known methods for generating ds.

In operation (B8), the memory controller 1000 generates F2 units of Reed-Solomon (RS) code overhead (i.e., F1 units of RS redundancy data) for t2-t1 columns of ds. For example, as is illustrated in item (i) of FIG. 3D, the memory controller 1000 may generate first stage 2 ds 347A including the first stage 2 ds units for each of first through seventh frames 31-37. Further, as is also illustrated in item (i) of FIG. 3D, the memory controller 1000 may generate second stage 2 ds 347B including the second stage 2 ds units for each of first through seventh frames 31-37. Further, according to at least some example embodiments of the inventive concepts, as is illustrated in item (i) of FIG. 3D, the memory controller 1000 may encode the next [t2–t1=9–7=2] columns of ds which have not yet been encoded using RS code. For example, the memory controller 1000 may concatenate the seven individual units of the first stage 2 ds 347A, and encode the concatenated units of the first stage 2 ds 347A using RS code, thereby generating F2=1 fourth RS overhead unit 350A. Further, the memory controller 1000 may concatenate the seven individual units of the second stage 2 ds 347B, and encode the concatenated units of the second stage 2 ds 347B using RS code, thereby generating F2=1 fifth RS overhead unit 350B. According to at least some example embodiments of the inventive concepts, each of the fourth through fifth RS overhead units 350A-350B may have the same size (e.g., the same number of bits) as the individual ds units included in the ds 347A-347B.

In operation (B9), for F2 frame(s), the memory controller 1000 encodes the frames using a code having an error correction capability of t2 bits, and sets the result of the encoding as a vector x. For example, the memory controller 1000 may encode F2=1 frame using BCH code having an error correction capability of t2=9 bits. According to at least some example embodiments of the inventive concepts, the F2 frame(s) encoded in operation (B9) may be the next F2 (e.g., 1) frame(s) among the F0=8 frames (i.e., all of the first through eighth frames 31-38) which have not yet been encoded. For example, in the example illustrated in FIGS. 3A-3F, in operation (B9), the memory controller 1000 encodes the information bits 310 of the only frame which has not yet been encoded in accordance with the present iteration of Algorithm 2, the eighth frame 38, thereby generating intermediate BCH redundancy data 362, as is shown in item (j) of FIG. 3E. As is illustrated in item (j) of FIG. 3E, for the eighth frame 38, the intermediate BCH redundancy data 362 includes $m_{BCH}*t2=8\times9=72$ bits. Next, the memory controller 1000 may set, as x vector $x_8$, information bits 310 and intermediate redundancy data 362 of the eighth frame 38.

In operation (B10), for each of the F2 frame(s), the memory controller 1000 calculates a y vector, and sets the vector yvec as vector y. According to at least some example embodiments of the inventive concepts, as will be discussed in greater detail below in section V of the present disclosure, a y vector, $y_r$, calculated in operation (B10) for an $r^{th}$ frame is a vector that, when added to a corresponding x vector, $x_r$, set in operation (B9) for the $r^{th}$ frame, results in a combined vector $v_r$ such that values of one or more units of ds generated for the vector $v_r$ match desired (e.g., pre-fixed) values.

Specifically, as will be discussed in greater detail below with reference to FIG. 3E, in operation (B10), the memory controller 1000 determines a third y vector, $y_8$ 364, such that, after vector $y_8$ 364 is added to x vector $x_8$ (i.e., the data of eighth frame 38 of item (j) of FIG. 3E), values of a stage 1 ds unit, a first stage 2 ds unit and a second stage 2 ds unit generated for the eighth frame 38 (i.e. combined vector $v_8$) will equal, respectively, the values of the third RS overhead unit 320C generated in operation (B3), and the fourth and fifth RS overhead units 350A and 350B generated in operation (B8).

Referring, again, to operation (B10), as is illustrated in item (k) of FIG. 3E, the memory controller 1000 may use the third, fourth and fifth RS overhead units 320C, 350A and 350B to generate the third y vector, $y_8$ 364, corresponding to the eighth frame 38. Next, in operation (B11), as is illustrated by item (l) in FIG. 3E, the memory controller 1000 combines the y vector corresponding to the eighth frame 38 (i.e., third y vector, $y_8$ 364) with the x vector corresponding to the eighth frame 38, x vector x8 generated in operation (B9) of Algorithm 2 (i.e., the information bits 310 and intermediate BCH redundancy data 362 corresponding to the eighth frame 38) thereby generating combined vector $v_8$ corresponding to the eighth frame 38. Combined vector $v_8$ includes information bits 310 and final BCH redundancy data 363 corresponding to the eighth frame 38. At this point, as was discussed above, if a stage 1 ds unit, a first stage 2 ds unit and a second stage 2 ds unit were generated based on eighth frame 38 (i.e., combined vector $v_8$), the values of stage 1 ds unit, first stage 2 ds unit and second stage 2 ds unit would be equal to the values of the third through fifth RS overhead units 320C, 350A and 350B, respectively.

Figure 3F:
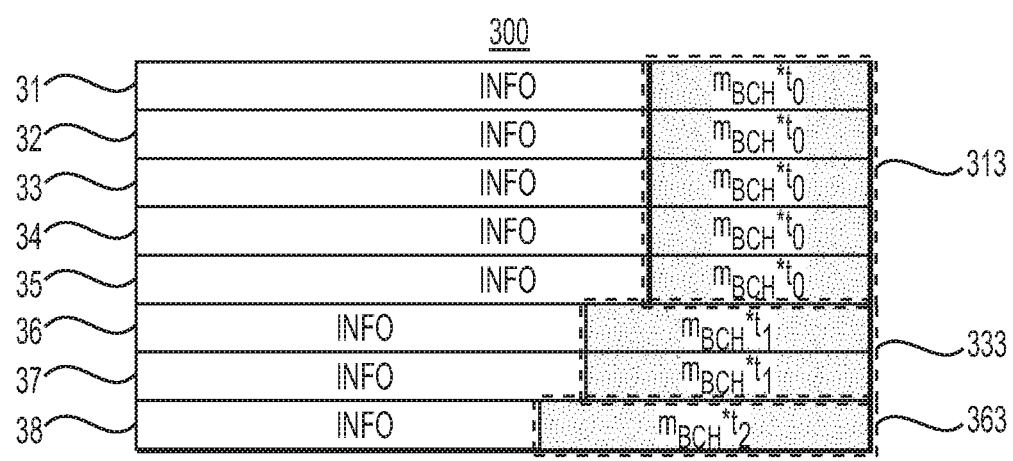

FIG. 3F illustrates an example codeword 300 resulting from performing the projected BCH encoding algorithm according to at least some example embodiments of the inventive concepts, on information bits of first through eighth frames 31-38, using Algorithm 2. As is illustrated in FIG. 3F, according to at least some example embodiments of the inventive concepts, the amount of information bits in the frames may decrease as the amount of redundancy data in the frames (e.g., the BCH redundancy data 313 corresponding to first through fifth frames 31-35, the final BCH redundancy data 333 corresponding to sixth through seventh frames 36 and 37, and the final BCH redundancy data 363 corresponding to eighth frame 38) increases.

Next, example methods for generating a BCH codeword having desired or, alternatively, pre-fixed delta syndrome values are discussed below in Section V of the present disclosure.

V. Example Methods for Generating a BCH Codeword Having Pre-Fixed Delta Syndrome Values The issue to be addressed may be viewed as determining how to create a BCH codeword such that delta syndrome values of the BCH codeword are guaranteed to have a desired or, alternatively, pre-fixed (i.e., predetermined) value.

An example solution to the above-referenced issue will now be discussed below with reference to Expressions 1-7. In Expressions 1-7, below, the notation $A_{[B\times C]}$ or $A_{B\times C}$ refers to a matrix (or vector) A that has the dimensions B×C.

One solution to the above-referenced issue of determining how to create a BCH codeword such that delta syndrome values of the BCH codeword have a desired or, alternatively, pre-fixed value may be defined with reference to the following constraints:

Let v=[u,p] be an n bits vector, where u is data bits and p is parity bits (e.g., having a size of $m_{BCH}\times t_1$ bits); and Satisfy Expression 1, below.

$$v\cdot H^T_{t_i}=v\cdot[H^T_{t_0}\Delta H^T_{t_1}]=[0\Delta s] \qquad \text{(Expression 1)}$$

Referring to Expression 1, the value Δs refers to a delta syndrome constraint. For example, according to at least some example embodiments of the inventive concepts, the delta syndrome constraint Δs may be associated with the aforementioned desired or, alternatively, predetermined delta syndrome value. For example, according to at least some example embodiments of the inventive concepts, the delta syndrome constraint $\Delta s$ may, itself, be the aforementioned desired or, alternatively, predetermined delta syndrome value.

According to at least some example embodiments of the inventive concepts, the above reference solution may be accomplished by breaking the problem into two parts: $V=X+\tilde{y}$.

1. Information part, x, should satisfy Expression 2, below.

$$x \cdot H^T_{t_1} = [0\ 0] \quad \text{(Expression 2)}$$

2. Constraint part $\tilde{y}$ should satisfy Expression 3, below.

$$\tilde{y} \cdot H^T_{t_1} = [0 \Delta s] \quad \text{(Expression 3)}$$

Satisfying Expression 2 may be achieved by encoding data u with of $m_{BCH} \times t_1$ parity bits in accordance with Expression 4, below.

$$p_x = \text{mod}(x^r \cdot u)(x), g_1(x)) \rightarrow x = [u_{[1 \times n-mt_1]} p x_{[1 \times mt_1]}] \quad \text{(Expression 4)}$$

Satisfying Expression 3 may be achieved through an algebraic solution. For example, according to at least some example embodiments of the inventive concepts, $H^T_{t_1}$ is full rank. Hence, Expression 5 can be determined as shown below.

$$H^T_{t_1} \cdot \tilde{U}_{mt_1 \times mt_1} = \begin{bmatrix} A \\ I_{mt_1} \end{bmatrix} \text{ and so } \tilde{y} \cdot \begin{bmatrix} A \\ I_{mt_1} \end{bmatrix} = [0\ \Delta s] \cdot \tilde{U} \quad \text{(Expression 5)}$$

Consequently, Expression 6, below, can be deduced.

$$\tilde{y} = [0\ y] \rightarrow y_{[1 \times mt_1]} = [0\ \Delta s_{[1 \times m \cdot \Delta t]}] \cdot \tilde{U}, \quad \text{(Expression 6)}$$

$$\text{Where } \tilde{U} = \begin{bmatrix} B \\ U \end{bmatrix}$$

As a result, a y value corresponding to the delta syndrome constraint $\Delta s$ may be determined in accordance with Expression 7, below.

$$y_{[1 \times mt_1]} = \Delta s_{[1 \times m \Delta t]} \cdot U_{[m \Delta t \times mt_1]} \quad \text{(Expression 7)}$$

Referring to Expression 7, above, according to at least some example embodiments of the inventive concepts, the memory controller 1000 may store a matrix U for every error correction capability t. According to at least some example embodiments of the inventive concepts, the matrices U are predetermined matrices. For example, the matrices U may be determined and stored in the memory controller 1000 before the operations of Algorithm 1 and/or Algorithm 2 are performed. According to at least some example embodiments of the inventive concepts, the matrices U are determined (e.g., offline) by a manufacturer or user of the memory controller 1000 and/or memory system 900, and the matrices U are stored by memory controller 1000 (e.g., in ROM 113 and/or RAM 112) before the memory controller 1000 performs ECC decoding operations. According to at least some example embodiments of the inventive concepts, the matrices U discussed in the present disclosure may be determined in accordance with known methods. For example, according to at least one example embodiment of the inventive concepts, the matrices U discussed in the present disclosure may be determined using methods described in US Patent Application Publication Number 2019/0007062.

Thus, according to at least some example embodiments of the inventive concepts, the memory controller 1000 may determine the y vectors discussed above with reference to Algorithm 2 based on a delta syndrome constraint $\Delta s$ and an appropriate U matrix, which may be stored in the memory controller 1000. For example, a discussion of applying, to operations (B4)-(B6) and (B9)-(B11) of Algorithm 2, methods for generating a BCH codeword having pre-fixed delta syndrome values according to at least some example embodiments will now be provided below.

As is noted in the discussion of Algorithm 2, above, in operation (B4), x vectors $x_6$ and $x_7$ are generated by encoding the sixth and seventh frames 36 and 37 using BCH code having an error correction capability of t1=7 bits, as is illustrated by item (e) of FIG. 3C.

Referring applying Expression 2, above, to operation (B4), it can be seen that $x_6 \cdot H^T_{t_1} = 0$ and $x_7 \cdot H^T_{t_1} = 0$, (where $x_6$ and $x_7$ are row vectors of length n, and $H_{t_1}$ is a matrix of size $m \cdot t_1$ over n).

As is noted in the discussion of Algorithm 2, above, in operation (B5) the memory controller 1000 determines $6^{th}$ and $7^{th}$ frame y vectors $y_6$ 334A and $y_7$ 334B, such that adding the $6^{th}$ and $7^{th}$ frame y vectors, $y_6$ 334A and vector $y_7$ 334B, to the $6^{th}$ and $7^{th}$ frame x vectors, $x_6$ and $x_7$, respectively, results in $6^{th}$ and $7^{th}$ frame combined vectors, $v_6$ and $v_7$, and the value of a stage 1 ds unit generated for the $6^{th}$ frame combined vector $v_6$ will equal the value of the first RS overhead unit 320A and the value of a stage 1 ds unit generated for the $7^{th}$ frame combined vector $v_7$ will equal the value of the second RS overhead unit 320B, as is illustrated by FIGS. 3B-3D. Further, in operation (B6) the memory controller 1000 generates $6^{th}$ frame combined vector $v_6$ by adding the $6^{th}$ frame x and y vectors, $x_6$ and $y_6$, together, and the memory controller 1000 generates the $7^{th}$ frame combined vector $v_7$ by adding the $7^{th}$ frame x and y vectors, $x_7$ and $y_7$, together.

By applying Expression 7, above, to operation (B5), the memory controller 1000 can execute operation (B5) by determining the $6^{th}$ and $7^{th}$ frame y vectors, $y_6$ and $y_7$, in accordance with Expression 8, below:

$$y_6 = \Delta s_6 \cdot U_{t1}, \text{ and}$$

$$y_7 = \Delta s_7 \cdot U_{t1}. \quad \text{(Expression 8)}$$

According to at least some example embodiments of the inventive concepts, in Expression 8, $6^{th}$ frame delta syndrome constraint $\Delta s_6$ is defined by the value of the first RS overhead unit 320A which was determined beforehand in operation (B3); $7^{th}$ frame delta syndrome constraint $\Delta s_7$ is defined by the value of the second RS overhead unit 320B which was also determined beforehand in operation (B3); and the matrix $U_{t1}$ may be a pre-calculated matrix that is stored in the memory controller 1000 and has a size of $m \cdot (t_1 - t_0) \times m \cdot t_1$ (i.e., $m \cdot \Delta t \times m \cdot t_1$).

Thus, the memory controller 1000 can execute operation (B6) by determining the $6^{th}$ and $7^{th}$ frame combined vectors, $v_6$ and $v_7$, in accordance with Expression 9, below:

$$v_6 = [0 y_6] + x_6, \text{ and}$$

$$v_7 = [0 y_7] + x_7, \quad \text{(Expression 9)}$$

where the $6^{th}$ and $7^{th}$ frame y vectors, $y_6$ and $y_7$, may each be padded with $n-m \cdot t_1$ zeros, as is illustrated, for example, in items (f) and (g) of FIG. 3C.

As is noted in the discussion of Algorithm 2, above, in operation (B9), $8^{th}$ frame x vector $x_8$ is generated by encoding the eighth frame 38 using BCH code having an error correction capability of t2=9 bits, as is illustrated by item (j) of FIG. 3E.

When Expression 2, above, is applied to operation (B9), it can be seen that $x_8 \cdot H^T_{t_2} = 0$ (where $x_8$ is a row vector of length n, and $H_{t_2}$ is a matrix of size $m \cdot t_2 \times n$).

As is noted in the discussion of Algorithm 2, above, in operation (B10) the memory controller 1000 determines the $8^{th}$ frame y vector $y_8$ 364, such that adding the $8^{th}$ frame y vector $y_8$ 364 to the $8^{th}$ frame x vector $x_8$ results in an $8^{th}$ frame combined vector $v_8$, and the values of a stage 1 ds unit, a first stage 2 ds unit and a second stage 2 ds unit generated for the $8^{th}$ combined vector $v_8$ will equal the values of the third RS overhead unit 320C generated in operation (B3), and the fourth and fifth RS overhead units 350A and 350B generated in operation (B8), respectively, as is illustrated by FIGS. 3D-3E.

Further, in operation (B11) the memory controller 1000 generates $8^{th}$ frame combined vector $v_8$ by adding the $8^{th}$ frame x and y vectors, $x_8$ and $y_8$, together.

By applying Expression 7, above, to operation (B10), $8^{th}$ frame y vector $y_8$ can be determined in accordance with Expression 10, below:

$$y_8 = \Delta s_8 \cdot U_{t_2}.$$ (Expression 10)

According to at least some example embodiments of the inventive concepts, in Expression 10, $8^{th}$ frame delta syndrome constraint $\Delta s_8$ is defined by the values of the third RS overhead unit 320C generated in operation (B3), and the fourth and fifth RS overhead units 350A and 350B generated in operation (B8); and the matrix $U_{t_2}$ may be a pre-calculated matrix that is stored in the memory controller 1000 and has a size of $m \cdot (t_2 - t_0) \times m \cdot t_2$ (i.e., $m \cdot \Delta t \times m \cdot t_2$).

Thus, the memory controller 1000 can execute operation (B11) by determining the $8^{th}$ frame completed vector $v_8$ in accordance with Expression 11, below:

$$v_8 = [0 y_8] + x_8,$$ (Expression 11)

where the $8^{th}$ frame y vector $y_8$ may be padded with $n - m \cdot t_2$ zeros, as is illustrated, for example, in items (k) and (l) of FIG. 3E.

Example decoding operations according at least some example embodiments of the inventive concepts will now be discussed below in Section VI of the present disclosure.

VI. Example Decoding Operations

According to at least some example embodiments of the inventive concepts, at some point after extended HPC encoding and projected BCH encoding have been performed on the HPC codeword 200 (i.e., in the manner discussed above with reference to Algorithms 1 and 2), and the memory controller 1000 has stored the HPC codeword 200 in the memory device 2000, the memory controller 1000 may read the stored HPC codeword 200 from the memory device 2000. For example, the memory controller may send one or more read commands to the memory device 2000. Next, the memory device 2000 may respond to the one or more read commands by reading bits of the HPC codeword 200 from the memory cells (e.g., memory page) of the memory cell array 2100 in which the HPC codeword 200 is stored, and transmitting the read bits of the HPC codeword 200 to the memory controller 1000. Further, according to at least some example embodiments of the inventive concepts, the memory controller 1000 may decode the received HPC codeword 200 by performing (e.g., using the decoder 1200) an inner code decoding operation followed by an outer code decoding operation.

For example, the inner code decoding operation may include sequentially decoding the rows and columns of the HPC codeword 200 (e.g., by performing extended Hamming code decoding on the rows and columns of the HPC codeword 200) in order to reduce decoding complexity. Further, improved performance may be achieved by performing maximum-likelihood decoding (MLD) (e.g., soft decoding) of the component codes. For example, according to at least some example embodiments, the decoder 1200 may be capable of performing (e.g., as part of the inner code decoding operation) soft-input/soft-output (SISO) decoding, which may be used to obtain improved performance when decoding the rows and columns of the codeword 200. For example, according to at least some example embodiments, the decoder 1200 may be or include a SISO decoder. Using a SISO decoder (e.g., the decoder 1200) for decoding the rows and columns of the codeword 200, the memory controller 1000 may iterate the sequential decoding of the rows and columns of the HPC codeword 200, thus reducing the bit error ratio (BER) after each iteration, as for CTC (Convolutional Turbo Code).

For example, the memory controller 1000 may use the decoder 1200 to apply perform SISO decoding on rows and then on columns and vice versa. In each such iteration, soft data may be moved from rows/columns to columns/rows, and after a number of iterations, the algorithm may converges (with high probability) to a codeword that satisfies both row and column conditions for the extended Hamming code.

Next, the memory controller 1000 may use the decoder 1200 to perform the outer code decoding in order to correct errors (if any) that still exist in the HPC codeword 200 after the aforementioned inner code decoding is complete. The outer code decoding operation may be used to improve an error floor of the overall decoding operation and also verify that the codeword 200 is error free. Error floor can be caused when the decoder 1200 finds a codeword that satisfies both row and column conditions for extended hamming code, but the remaining error pattern has too many errors for the outer code to correct. However, according to at least some example embodiments of the inventive concepts, by performing projected BCH encoding on rows of the HPC codeword 200 in accordance with Algorithm 2 discussed above, the effectiveness of the outer code decoding operation performed by the memory controller 1000 may be improved, and thus, the impact of an error floor associated with the outer code decoding operation may be reduced. An example outer code decoding operation according to at least some example embodiments of the inventive concepts is illustrated below by Algorithm 3. Operations of Algorithm 3 are illustrated below using pseudocode. According to at least some example embodiments of the inventive concepts, each operation of Algorithm 3 may be performed by, or under the control of, the memory controller 1000 (e.g., using the microprocessor 111).

---

Algorithm 3

(C1) After inner code decoding is performed on frames, perform BCH decoding on the frames;
(C2) Determine which of the frames are error frames and which of the frames are correct frames;
(C3) For each correct frame, generate stage 1–N delta syndromes;
(C4) Use RS redundancy information embedded in the generated delta syndromes torecover delta syndromes of error frames;
(C5) For error frames corresponding to recovered delta syndromes, perform BCH decoding using the enhanced error correction capability Algorithm 3 provided by the recovered delta syndromes;
(C6) If end condition is met, end;
Else, return to (C2).

For the purpose of simplicity, Algorithm 3 is described, below, with reference to codeword 300. Algorithm 3 will be described, below, with reference to a scenario in which the codeword 300 of FIG. 3F has been encoded in accordance with Algorithm 1 and Algorithm 2 (i.e., where operation A2 of Algorithm 1 is accomplished using Algorithm 2).

Though, for the purpose of simplicity, Algorithm 3 is explained below with reference to 8 frames of bits included in codeword 300, Algorithm 3 may be performed with respect to more than 8 frames of data. For example, the memory controller 1000 may perform Algorithm 3 with respect to the 192 frames of bits included in HPC codeword 200 illustrated in FIG. 2.

In operation (C1), after the memory controller 1000 completes the aforementioned inner decoding operation on rows and columns of the codeword 300, the memory controller 1000 performs a BCH decoding operation on the frames of the codeword 300 (i.e., first frame 31—eighth frame 38).

In operation (C2), the memory controller 1000 determines which of first through eighth frames 31-38 have been correctly decoded (referred to in the present disclosure as "correct frames") and which of first through eighth frames 31-38 include errors (referred to in the present disclosure as "error frames"), in accordance with known BCH decoding methods.

In operation (C3), for each correct frame among first through eighth frames 31-38, the memory controller 1000 generates the 1st-Nth stage delta syndromes corresponding to the correct frame. According to at least some example embodiments of the inventive concepts, N refers to the maximum stage for which delta syndromes are generated. In the example of codeword 300 discussed above with reference to FIGS. 3A to 3F, there are two stages of delta syndromes (e.g., stage 1 delta syndromes 317A illustrated in item (c) in FIG. 3C and first and second stage 2 delta syndromes 347A and 347B illustrated in item (i) of FIG. 3D), and thus, N=2.

Operation (C3) also includes generating embedded RS redundancy data as delta syndromes. Specifically, as is discussed above with reference to FIGS. 3A-3F and Section V of the present disclosure, with respect to combined vectors v6 and v7 (which correspond to the sixth and seventh frames, 36 and 37, of codeword 300, respectively), the value of a stage 1 ds unit generated for the combined vector v6 will equal the value of the first RS overhead unit 320A and the value of a stage 1 ds unit generated for the combined vector v7 will equal the value of the second RS overhead unit 320B. Consequently, RS redundancy data is embedded in the stage 1 ds units generated for the sixth and seventh frames, 36 and 37, in operation (C3).

Further, as is also discussed above with reference to FIGS. 3A-3F and Section V of the present disclosure, with respect to combined vectors v8 (which corresponds to the eighth frame 38 of codeword 300), the values of a stage 1 ds unit, a first stage 2 ds unit and a second stage 2 ds unit generated for the combined vector v8 will equal the values of the third RS overhead unit 320C generated in operation (B3) of Algorithm 2, and the fourth and fifth RS overhead units 350A and 350B generated in operation (B8) of Algorithm 2, respectively, as is illustrated by FIGS. 3D-3E. Consequently, RS redundancy data is embedded in the stage 1 and stage 2 ds units generated for the eighth frame, 38, in operation (C3).

In operation (C4), the memory controller 1000 uses the RS redundancy embedded in the delta syndromes of correct frames, from among first through eighth frames 31-38, to recover delta syndromes of error frames. For example, if the first frame 31 is an error frame, then the memory controller 1000 may not be able to reliably generate 1st-Nth stage delta syndromes using the data of the first frame 31, which includes an error. However, if the sixth through eighth frames 36-38 are correct frames, the memory controller 1000 can use the RS overhead 320 (illustrated in item (d) of FIG. 3B) together with the stage 1 ds units of other correct frames to generate a RS delta syndrome codeword such that the RS delta syndrome codeword includes, as redundancy bits, bits of the RS overhead 320 and includes, as information bits, bits of the stage 1 ds units of the other correct frames. Further, the memory controller 1000 may perform an RS decoding operation on the aforementioned RS delta syndrome codeword, thereby recovering the stage 1 ds unit corresponding to the first frame 31, so long as the total number of error frames from among the first through eighth frames 31-38 does not exceed the erroneous row limit for stage 1, F1, which is 3 for codeword 300, as is discussed in section IV of the present disclosure.

In operation (C5), for error frames that correspond to at least one delta syndrome recovered in operation (C4), the memory controller 1000 uses the recovered delta syndrome(s) to perform BCH decoding again with additional error correction capability Δt provided by the at least one recovered delta syndrome to which the error frame corresponds. For example, if the first frame 31 includes 7 error bits, the BCH decoding operation performed in operation (C1) for first frame 31 will be unsuccessful, because the BCH decoding operation performed in operation (C1) has an error correction capability of t0=6, which is less than 7. However, with the aid of the stage 1 delta syndrome of the first frame 31 which was recovered in operation (C4), the BCH decoding operation performed by the memory controller 1000 in operation (C5) will have an error correction capability of t1=7, which would be sufficient to correct the 7 error bits in the first frame 31.

Next, in operation (C6), if the memory controller 1000 determines that an end condition has been met, the memory device may end the outer code decoding operation. Example end conditions include, but are not limited to, the memory controller 1000 determining that all error frames have been corrected; and the memory device determining that the total number of error frames exceeds the erroneous row limit, Fi, for a current stage i of the outer code decoding operation.

Further, if, in operation (C6), the memory controller 1000 determines that no error condition has been met, the memory controller 1000 returns to operation (C2) to determine the number of error frames among first through eighth frames. If the delta syndrome-enhanced BCH decoding operation performed in operation (C5) was successful with respect to correcting one or more of the error frames, then the total number of error frames determined in a subsequent iteration of operation (C2) will be reduced in comparison to a previous iteration of operation (C2).

As operations (C2)-(C6) are preformed iteratively, more error frames may be corrected during each iteration. Further, as more error frames are corrected, more delta syndromes can be generated by the memory controller 1000, and thus, the chances of being able to recover higher stage delta syndromes increases. As higher stage delta syndromes are recovered, the number of error bits which can be corrected by the BCH decoding operation performed in operation (C5) increases, and thus error frames that have too many error bits to be corrected during an early iteration of operation (C5) may be corrected by a later iteration of operation (C5). According to at least some example embodiments of the inventive concepts, an $i^{th}$ iteration of operations (C2)-(C6) corresponds to an $i^{th}$ stage outer code decoding operation.

Example implementations of the memory system 900 will now be discussed below in Section VII of the present disclosure.

VII. Implementation Examples

Figure 4:
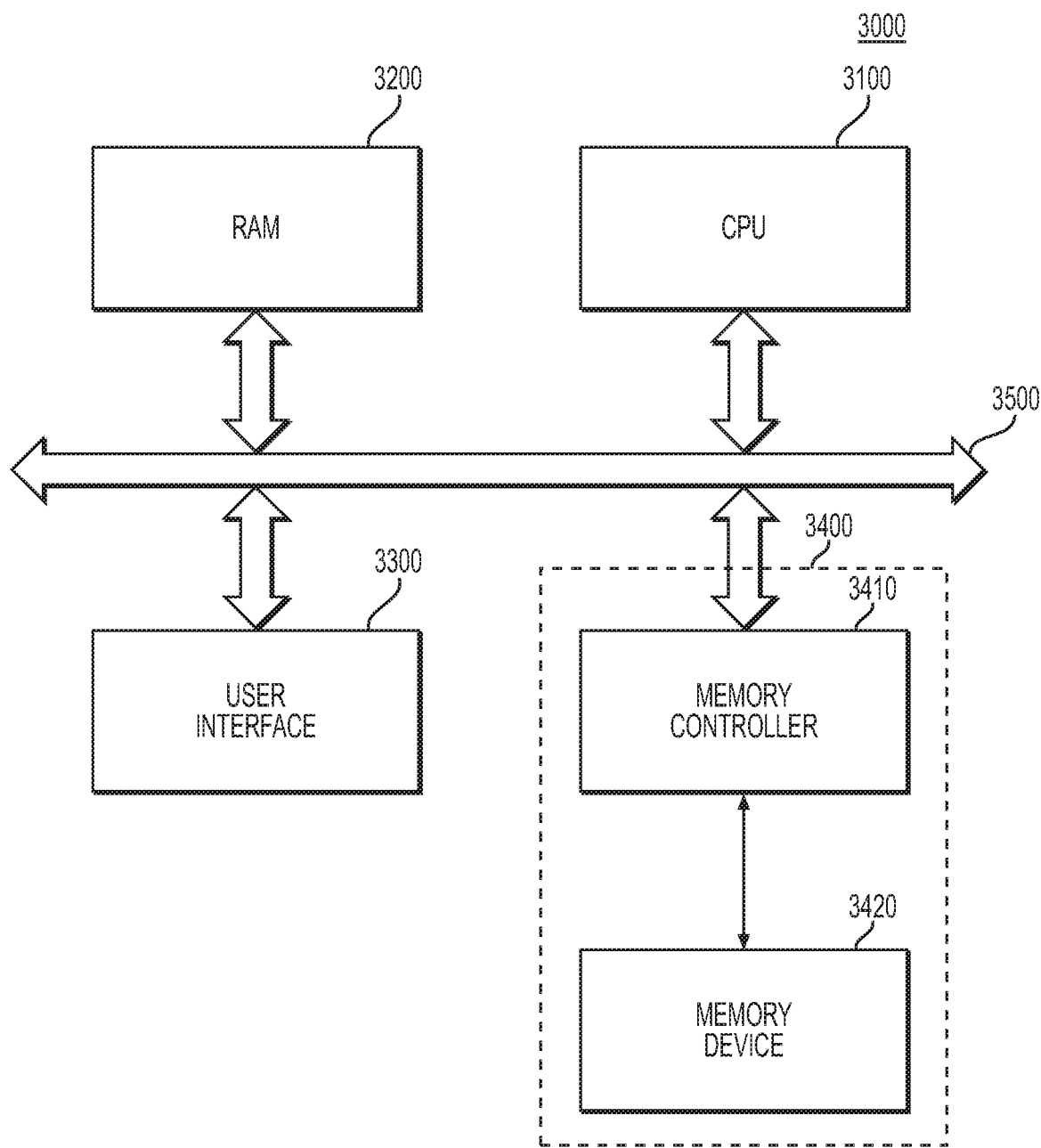
FIG. 4 is a block diagram showing a computer system including a memory system according to example embodiments of inventive concepts.

FIG. 4 is a block diagram showing a computer system 3000 including a memory system according to at least one example embodiment of the inventive concepts. The computer system 3000, such as a mobile device, a desktop computer, and a server, may employ a memory system 3400 according to at least one example embodiment of the inventive concepts.

The computer system 3000 may include a central processing unit 3100, a RAM 3200, a user interface 3300, and the memory system 3400, are electrically connected to buses 3500. The host as described above may include the central processing unit 3100, the RAM 3200, and the user interface 3300 in the computer system 3000. The central processing unit 3100 may control the entire computer system 3000 and may perform calculations corresponding to user commands input via the user interface 3300. The RAM 3200 may function as a data memory for the central processing unit 3100, and the central processing unit 3100 may write/read data to/from the memory system 3400.

As in example embodiments of inventive concepts described above, the memory system 3400 may include a memory controller 3410 and a memory device 3420.

According to at least one example embodiment of the inventive concepts, the memory controller 3410 may be implemented by the memory controller 1000 discussed above with reference to FIGS. 1A-2C and the memory device 3420 may be implemented by the memory device 2000 discussed above with reference to FIGS. 1A-2C.

Figure 5:
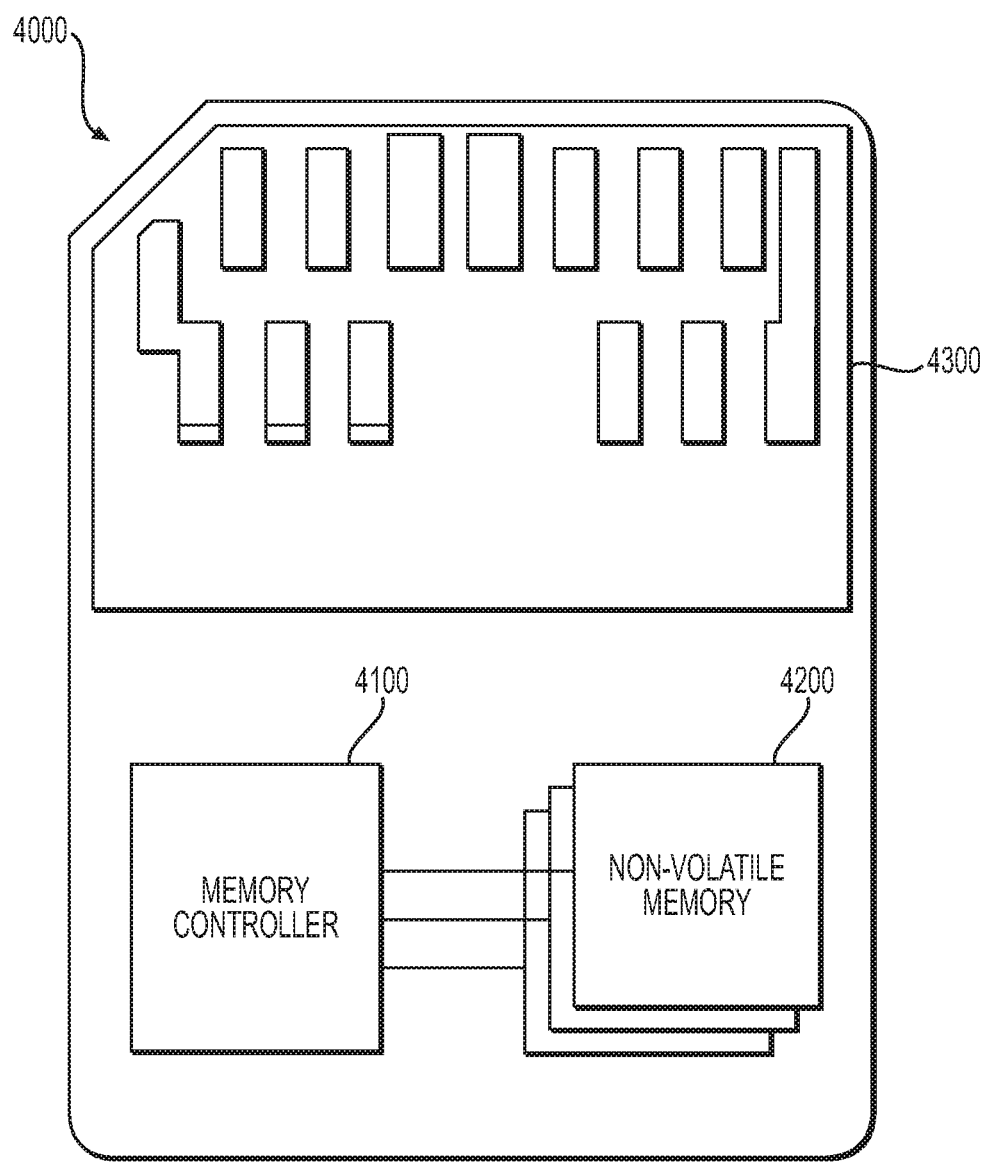
FIG. 5 is a block diagram showing a memory card according to at least one example embodiment of the inventive concepts.

FIG. 5 is a block diagram showing a memory card 4000 according to at least one example embodiment of the inventive concepts. A memory system 900 according to at least some example embodiments of inventive concepts discussed above with reference to FIGS. 1-3F may be the memory card 4000. For example, the memory card 4000 may include an embedded multimedia card (eMMC) or a secure digital (SD) card. As shown in FIG. 5, the memory card 4000 may include a memory controller 4100, a non-volatile memory 4200, and a port region 4300. According to at least one example embodiment of the inventive concepts, the memory controller 4100 may be implemented by the controller 1000 discussed above with reference to FIGS. 1-3F, and the non-volatile memory 4200 shown in FIG. 5 may be implemented by the memory device 2000 discussed above with reference to FIGS. 1-3F.

The memory controller 4100 may communicate with an external host via the port region 4300 in compliance with a pre-set protocol. The protocol may be eMMC protocol, SD protocol, SATA protocol, SAS protocol, or USB protocol.

Figure 6:
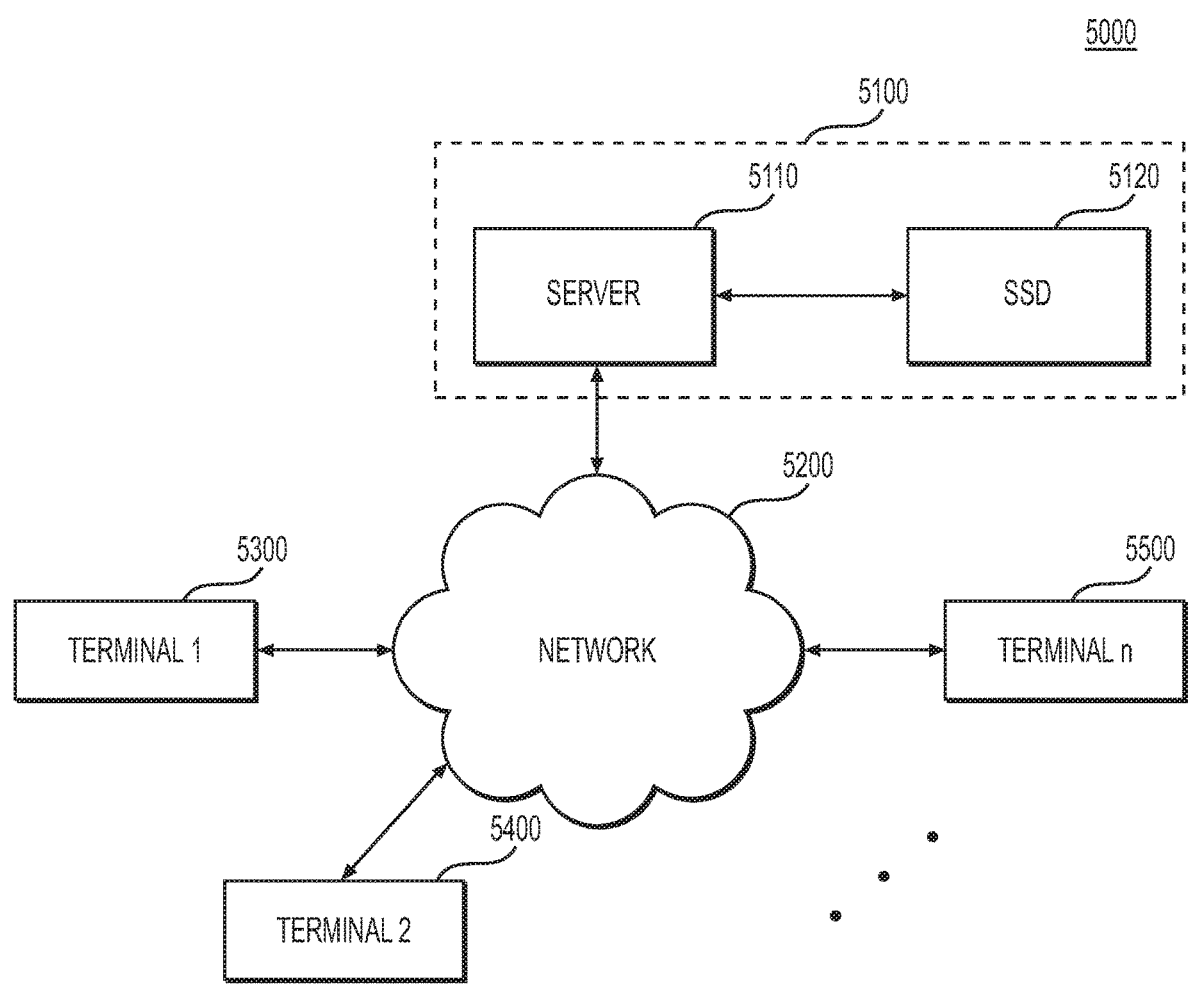
FIG. 6 is a block diagram showing an example network system including a memory system according to at least one example embodiment of the inventive concepts.

FIG. 6 is a block diagram showing an example network system 5000 including a memory system according to at least one example embodiment of the inventive concepts. As shown in FIG. 6, the network system 5000 may include a server system 5100 and a plurality of terminals 5300, 5400, and 5500 that are connected via a network 5200. The server system 5100 may include a server 5110 for processing requests received from the plurality of terminals 5300, 5400, and 5500 connected to the network 5200 and a SSD 5120 for storing data corresponding to the requests received from the terminals 5300, 5400, and 5500. Here, the SSD 5120 may be a memory system according to at least one example embodiment of the inventive concepts.

According to at least one example embodiment of the inventive concepts, SSD 5120 may be implemented by the memory system 900 discussed above with reference to FIGS. 1-3F.

Meanwhile, a memory system according to example embodiments of inventive concepts may be mounted via any of various packages. For example, a memory system according to at least one example embodiment of the inventive0 concepts may be mounted via any of packages including package on package (PoP), ball grid arrays(BGAs), chip scale packages(CSPs), plastic leaded chip Carrier (PLCC), plastic dual in-line package(PDIP), die in waffle pack, die in wafer form, chip on board (COB), ceramic dual in-line package (CERDIP), plastic metricquad flat pack(MQFP), thin quad flatpack (TQFP), small outline (SOIC), shrink small outline package (SSOP), thin small outline (TSOP), thin quad flatpack (TQFP), system in package (SIP), multi chip package(MCP), wafer-level fabricated package (WFP), wafer-level processed stack package(WSP), etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory system comprising:
a memory controller; and
a memory device,
wherein the memory controller is configured to,
perform first error correcting code (ECC) encoding on a plurality of first frames of data,
generate a plurality of delta syndrome units for the plurality of first frames of data, the plurality of delta syndrome units corresponding one-to-one with the plurality of first frames of data,
generate a delta syndrome codeword by concatenating the plurality of delta syndrome units and performing second ECC encoding on the concatenated plurality of delta syndrome units, the delta syndrome codeword including one or more redundancy data units,
perform third error correcting code (ECC) encoding on at least one second frame of data such that the encoded at least one second frame of data is a first vector of bits, the at least one second frame of data following the plurality of first frames of data,
determine a second vector of bits such that a value of another delta syndrome unit generated based on a combined vector of bits, which is a sum of the first vector of bits and the second vector of bits, is pre-fixed based on at least one of the one or more redundancy data units,
generate the combined vector of bits by adding the second vector of bits and the first vector of bits.

2. The memory system of claim 1, wherein the memory controller is further configured to,
generate a Hamming product code (HPC) codeword by performing extended Hamming code encoding on columns of bits from among bits of the plurality of encoded first frames of data and the combined vector of bits, and
store the HPC codeword in the memory device.

3. The memory system of claim 2, wherein the memory controller is further configured such that the first ECC encoding and the third ECC encoding are Bose-Chaudhuri-Hocquenghem (BCH) encoding.

4. The memory system of claim 3, wherein the memory controller is further configured such that the second ECC encoding is Reed-Solomon (RS) encoding.

5. The memory system of claim 1,
wherein the memory controller is further configured such that,
the memory controller receives a plurality of information bits from an external device,
the memory controller arranges the plurality of information bits in a 2-dimensional array of bits including rows and columns, and
the memory controller performs extended Hamming code encoding on the columns of the array of bits thereby generating a plurality of extended Hamming code-encoded columns of bits,
wherein each frame of data from among the plurality of first frames of data and the at least one second frame of data is a row of bits from among the plurality of extended Hamming code-encoded columns of bits such that the plurality of encoded first frames of data and the combined vector of bits are each a frame of a Hamming product code (HPC) codeword, and
wherein the memory controller is further configured to store the HPC codeword in the memory device.

6. The memory system of claim 5, wherein the memory controller is further configured such that the first ECC encoding and the third ECC encoding are Bose-Chaudhuri-Hocquenghem (BCH) encoding.

7. The memory system of claim 6, wherein the memory controller is further configured such that the second ECC encoding is Reed-Solomon (RS) encoding.

8. A memory system comprising:
a memory controller; and
a memory device,
wherein the memory controller is configured to,
read a plurality of frames of data from the memory device,
correct errors in one or more frames of data, from among the plurality of frames of data, by performing first error correcting code (ECC) decoding on the plurality of frames of data,
identify, after the first ECC decoding, a plurality of correct frames and at least one error frame from among the plurality of frames of data,
generate a plurality of delta syndrome units based on plurality of correct frames, the plurality of delta syndrome units corresponding one-to-one with the plurality of correct frames,
generate, based on the plurality of delta syndrome units of the plurality of correct frames, a delta syndrome ECC codeword that includes information bits and redundancy bits such that,
the redundancy bits of the delta syndrome ECC codeword are bits of at least one delta syndrome unit from among the generated plurality of delta syndrome units, and
the information bits of the delta syndrome ECC codeword are bits of one or more delta syndrome units other than the at least one delta syndrome unit, from among the generated plurality of delta syndrome units, and
recover a delta syndrome unit corresponding to the at least one error frame by performing second ECC decoding on the delta syndrome ECC codeword.

9. The memory system of claim 8, wherein the memory controller is further configured to read the plurality of frames of data from the memory device by reading a Hamming product code (HPC) codeword from the memory device, the HPC codeword including the plurality of frames of data.

10. The memory system of claim 8, wherein the memory controller is further configured to use the recovered delta syndrome unit to perform BCH decoding on the at least one error frame, the recovered delta syndrome unit being data that increases an error correction capability of redundancy data included in the at least one error frame.

11. The memory system of claim 8, wherein the memory controller is further configured such that the first ECC decoding is Bose-Chaudhuri-Hocquenghem (BCH) decoding.

12. The memory system of claim 11, wherein the memory controller is further configured such that the second ECC decoding is Reed-Solomon (RS) decoding.

13. The memory system of claim 12, wherein the memory controller is further configured to use the recovered delta syndrome unit to perform BCH decoding on the at least one error frame, the recovered delta syndrome unit being data that increases an error correction capability of BCH redundancy data included in the at least one error frame.

14. A method of operating a memory system including a memory controller and a memory device, the method comprising:
performing first error correcting code (ECC) encoding on a plurality of first frames of data;
generating a plurality of delta syndrome units for the plurality of first frames of data, the plurality of delta syndrome units corresponding one-to-one with the plurality of first frames of data;
generating a delta syndrome codeword by concatenating the plurality of delta syndrome units and performing second ECC encoding on the concatenated plurality of delta syndrome units, the delta syndrome codeword including one or more redundancy data units;
performing third error correcting code (ECC) encoding on at least one second frame of data such that the encoded at least one second frame of data is a first vector of bits, the at least one second frame of data following the plurality of first frames of data;
determining a second vector of bits such that a value of another delta syndrome unit generated based on a combined vector of bits, which is a sum of the first vector of bits and the second vector of bits, is pre-fixed based on at least one of the one or more redundancy data units; and
generating the combined vector of bits by adding the second vector of bits and the first vector of bits.

15. The method of claim 14, further comprising:
generating a Hamming product code (HPC) codeword by performing extended Hamming code encoding on columns of bits from among bits of the plurality of encoded first frames of data and the combined vector of bits, and storing the HPC codeword in the memory device.

16. The method of claim 15, wherein the first ECC encoding and the third ECC encoding are Bose-Chaudhuri-Hocquenghem (BCH) encoding.

17. The method of claim 16, wherein the second ECC encoding is Reed-Solomon (RS) encoding.

18. The method of claim 14, further comprising:
receiving a plurality of information bits from an external device;
arranging the plurality of information bits in a 2-dimensional array of bits including rows and columns;
performing extended Hamming code encoding on the columns of the array of bits thereby generating a plurality of extended Hamming code-encoded columns of bits, each frame of data from among the plurality of first frames of data and the at least one second frame of data being a row of bits from among the plurality of extended Hamming code-encoded columns of bits such that the plurality of encoded first frames of data and the combined vector of bits are each a frame of a Hamming product code (HPC) codeword; and
storing the HPC codeword in the memory device.

19. The method of claim 18, wherein the first ECC encoding and the third ECC encoding are Bose-Chaudhuri-Hocquenghem (BCH) encoding.

20. The method of claim 19, wherein the second ECC encoding is Reed-Solomon (RS) encoding.

* * * * *